(12) United States Patent
Lee et al.

(10) Patent No.: US 10,116,286 B2
(45) Date of Patent: Oct. 30, 2018

(54) REFERENCE CLOCK SIGNAL GENERATORS AND METHODS FOR GENERATING A REFERENCE CLOCK SIGNAL

(71) Applicant: Agency for Science, Technology and Research, Singapore (SG)

(72) Inventors: Junghyup Lee, Singapore (SG); Minkyu Je, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/329,558

(22) PCT Filed: Sep. 7, 2015

(86) PCT No.: PCT/SG2015/050306
§ 371 (c)(1),
(2) Date: Jan. 26, 2017

(87) PCT Pub. No.: WO2016/039688
PCT Pub. Date: Mar. 17, 2016

(65) Prior Publication Data
US 2017/0214392 A1 Jul. 27, 2017

(30) Foreign Application Priority Data

Sep. 8, 2014 (SG) .............. 10201405567S

(51) Int. Cl.
*G06F 1/04* (2006.01)
*H03K 3/00* (2006.01)
(Continued)

(52) U.S. Cl.
CPC ........... *H03K 3/012* (2013.01); *H03K 3/0231* (2013.01)

(58) Field of Classification Search
CPC ...................................... H03K 3/012
(Continued)

(56) References Cited

U.S. PATENT DOCUMENTS

| 4,746,871 A | 5/1988 | de la Plaza |
| 5,552,748 A | 9/1996 | O'Shaughnessy |

(Continued)

FOREIGN PATENT DOCUMENTS

| JP | H04-94201 A | 3/1992 |
| JP | 2002-300027 A | 10/2002 |

OTHER PUBLICATIONS

Tokunaga, et al., "An On-Chip CMOS Relaxation Oscillator with Voltage Averaging Feedback," IEEE Journal of Solid-State Circuits, vol. 45, Jun. 2010, pp. 2250-1158.
(Continued)

*Primary Examiner* — Lincoln Donovan
*Assistant Examiner* — Metasebia Retebo
(74) *Attorney, Agent, or Firm* — Winstead, P.C.

(57) ABSTRACT

According to various embodiments, there is provided a method for generating a reference clock signal, the method including discharging a capacitive element to a discharged state, when a reset signal has a predetermined reset state; charging the capacitive element from the discharged state to a first voltage, when a charge signal has a predetermined charge state; comparing the first voltage to a zero voltage, when a compare signal has a predetermined compare state; generating a second voltage based on the comparing of the first voltage to the zero voltage; generating a clock signal based on the second voltage, using an oscillator; and generating each of the reset signal, the charge signal and the compare signal, based on the clock signal.

20 Claims, 16 Drawing Sheets

(51) Int. Cl.
*H03K 3/012* (2006.01)
*H03K 3/0231* (2006.01)

(58) Field of Classification Search
USPC .......................................................... 327/291
See application file for complete search history.

(56) References Cited

U.S. PATENT DOCUMENTS

| | | | | |
|---|---|---|---|---|
| 5,973,572 | A * | 10/1999 | Ukita | H03L 7/085 |
| | | | | 327/5 |
| 6,166,581 | A | 12/2000 | Liu et al. | |
| 6,535,071 | B2 * | 3/2003 | Forbes | H03B 5/24 |
| | | | | 331/108 B |
| 8,076,981 | B2 | 12/2011 | Shikata | |
| 2006/0063502 | A1 | 3/2006 | Shibuya et al. | |
| 2007/0052486 | A1 | 3/2007 | Tseng | |
| 2011/0057731 | A1 | 3/2011 | Yousset et al. | |
| 2011/0248786 | A1 | 10/2011 | Sako et al. | |
| 2012/0319738 | A1 * | 12/2012 | Nakamura | H03L 1/022 |
| | | | | 327/102 |
| 2013/0154699 | A1 | 6/2013 | Tokunaga et al. | |
| 2016/0115570 | A1 * | 4/2016 | Zuckermann | C22C 9/05 |
| | | | | 420/487 |

OTHER PUBLICATIONS

Choe, et al., "A Precision Relaxation Oscillator with a Self-Clocked Offset-Cancellation Scheme for Implantable Biomedical SoCs," IEEE International Solid-State Circuits Conference, 2009, pp. 402-403.

Cao, et al., "A 63,000 Q-Factor Relaxation Oscillator with Switched-Capacitor Integrated Error Feedback," IEEE International Solid-State Circuits Conference, 2013, pp. 186-187.

Linear Technology, "LTC6930 Datasheet," 2014, pp. 1-14.

Arakali, et al., "Low-Power Supply-Regulation Techniques for Ring Oscillators in Phase-Locked Loops Using a Split-Tuned Architecture," IEEE Journal of Solid-State Circuits, vol. 44, No. 8, Aug. 2009, pp. 2169-2181.

Lee, et al., "A 10 MHz 80 µW 67 ppm/° C. CMOS Reference Clock Oscillator with a Temperature Compensated Feedback Loop in 0.18 µm CMOS," IEEE Symposium on VLSI Circuits, 2009, pp. 226-227.

Leung, et al., "A sub-1-V 15-ppm/° C. CMOS Bandgap Voltage Reference Without Requiring Low Threshold Voltage Device," IEEE Journal of Solid-State Circuits, vol. 37, No. 4, Apr. 2002, pp. 526-530.

International Preliminary Report on Patentability for International Application No. PCT/SG2015/050306 dated Aug. 12, 2016, pp. 1-7.

* cited by examiner

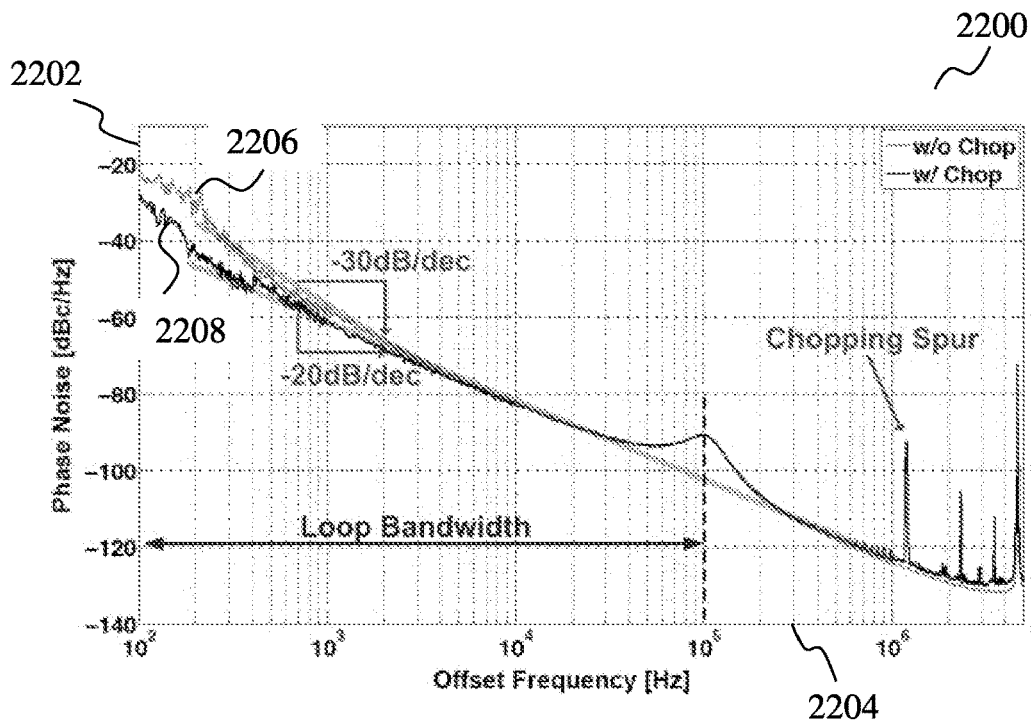

FIG. 22

| Parameters | JSSC 2010 [1] | ISSCC 2009 [2] | ISSCC 2013 [3] | LTC6930 [4] | This Work |
|---|---|---|---|---|---|
| Technology [nm CMOS] | 180 | 130 | 65 | N/A | 180 |
| Decoupling Capacitor | N/A | N/A | N/A | Needed (100nF) | None |
| Supply Regulator | None | None | None | Needed | None |
| Frequency [MHz] | 14 | 3.2 | 12.6 | 5 | 4.7 |
| Area [mm²] | 0.04 (Core) | 0.073 (Core) | 0.01 (Core) | N/A | 0.086 (Overall) |
| Min. $V_{DD}$ [V] | 1.7 | 1.4 | 1.1 | 1.7 | 1.4 |
| Power [µW] | 45 | 38 | 98.4 | 340 | 53 |
| Period RMS Jitter [%] | 0.04 | 0.14 | ~0.07 | 0.11 | 0.04 |
| Worst-Case PSNR [dB] | N/A | N/A | N/A | 9[1] | -22 |
| Freq. Variation [%] to $V_{DD}$ | ±0.16 @1.7 to 1.9V | ±0.4 @1.4 to 1.6V | ±0.07 @1.1 to 1.5V | ±0.1 @1.7 to 3.7V | <±0.2 @1.4 to 3.3V |
| Freq. Variation [%] to Temp. | ±0.19[2] @-40 to 125°C | ±0.25 @20 to 60°C | ±0.82 @0 to 80°C | <±0.6 @-40 to 125°C | <±0.35 @-40 to 125°C |
| Samples | 1 | 1 | 1 | Commercial Product | 5 |

[1] With a decoupling capacitor of 0.1µF
[2] With a temperature compensation voltage

FIG. 23

REFERENCE CLOCK SIGNAL GENERATORS AND METHODS FOR GENERATING A REFERENCE CLOCK SIGNAL

CROSS-REFERENCE TO RELATED APPLICATIONS

This application claims the benefit of Singapore Patent Application number 10201405567S filed 8 Sep. 2014, the entire contents of which are incorporated herein by reference for all purposes.

TECHNICAL FIELD

The present invention relates to reference clock signal generators and methods for generating a reference clock signal.

BACKGROUND

Low-power Complementary Metal-Oxide Semiconductor (CMOS) reference clock oscillators may be used in miniaturized system-on-chips (SoCs) for emerging microsystems such as implantable biomedical devices and smart sensors, which require low power consumption and small system sizes. In such miniaturized SoCs, the supply voltage may be low while the level of analog and digital circuit integration may be high to meet rigorous power and area constraints. As such, noise from other blocks, especially digital blocks coupled through supply and ground lines, may become a serious threat that degrades the performance of CMOS reference clock oscillators.

Low-power CMOS reference clock signal generators may be based on relaxation oscillators which may provide frequency stability and low noise. State-of-the-art reference clock signal generators may not have immunity to noise from supply and ground lines, as the state-of-the-art reference clock signal generators may include supply-sensitive building blocks, such as reference voltage generators and single-ended comparators. One solution to overcome the noise from supply and ground lines may be to use large external decoupling capacitors. However, large external decoupling capacitors may not be suitable for applications which need to be small in size and low in cost. Another solution for making the reference clock oscillators immune to supply noise may be to regulate the supply line with a band-gap voltage regulator. However, band-gap voltage regulators tend to be high in power consumption and may also be large in size. Moreover, even with the use of band-gap voltage regulator, decoupling capacitors of several hundreds of nanofarads may still be required to remove high frequency noise, as the power supply rejection ratio of band-gap voltage regulators may start to deteriorate from around tens of kilohertz.

Therefore, there is a need for a new reference clock signal generator which can be immune to noise from supply and ground lines, while being suitable for power and area-restricted applications.

SUMMARY

According to various embodiments, there may be provided a method for generating a reference clock signal, the method including discharging a capacitive element to a discharged state, when a reset signal has a predetermined reset state; charging the capacitive element from the discharged state to a first voltage, when a charge signal has a predetermined charge state; comparing the first voltage to a zero voltage, when a compare signal has a predetermined compare state; generating a second voltage based on the comparing of the first voltage to the zero voltage; generating a clock signal based on the second voltage, using an oscillator; and generating each of the reset signal, the charge signal and the compare signal, based on the clock signal.

According to various embodiments, there may be provided a reference clock signal generator including a discharging circuit configured to discharge a capacitive element to a discharged state, when a reset signal has a predetermined reset state; a charging circuit configured to charge the capacitive element from the discharged state to a first voltage, when a charge signal has a predetermined charge state; a comparison circuit configured to compare the first voltage to a zero voltage when a compare signal has a predetermined compare state, wherein the comparison circuit is further configured to generate a second voltage based on the comparing of the first voltage to the zero voltage; an oscillator configured to generate a clock signal based on the second voltage; and a control logic circuit configured to generate each of the reset signal, the charge signal and the compare signal, based on the clock signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 22 shows a graph showing phase noise plotted against frequency offset from carrier.

FIG. 23 shows a table summarizing the performance of a reference clock signal generator according to various embodiments, as compared to other state-of-the-art designs.

DESCRIPTION

Figure 1:
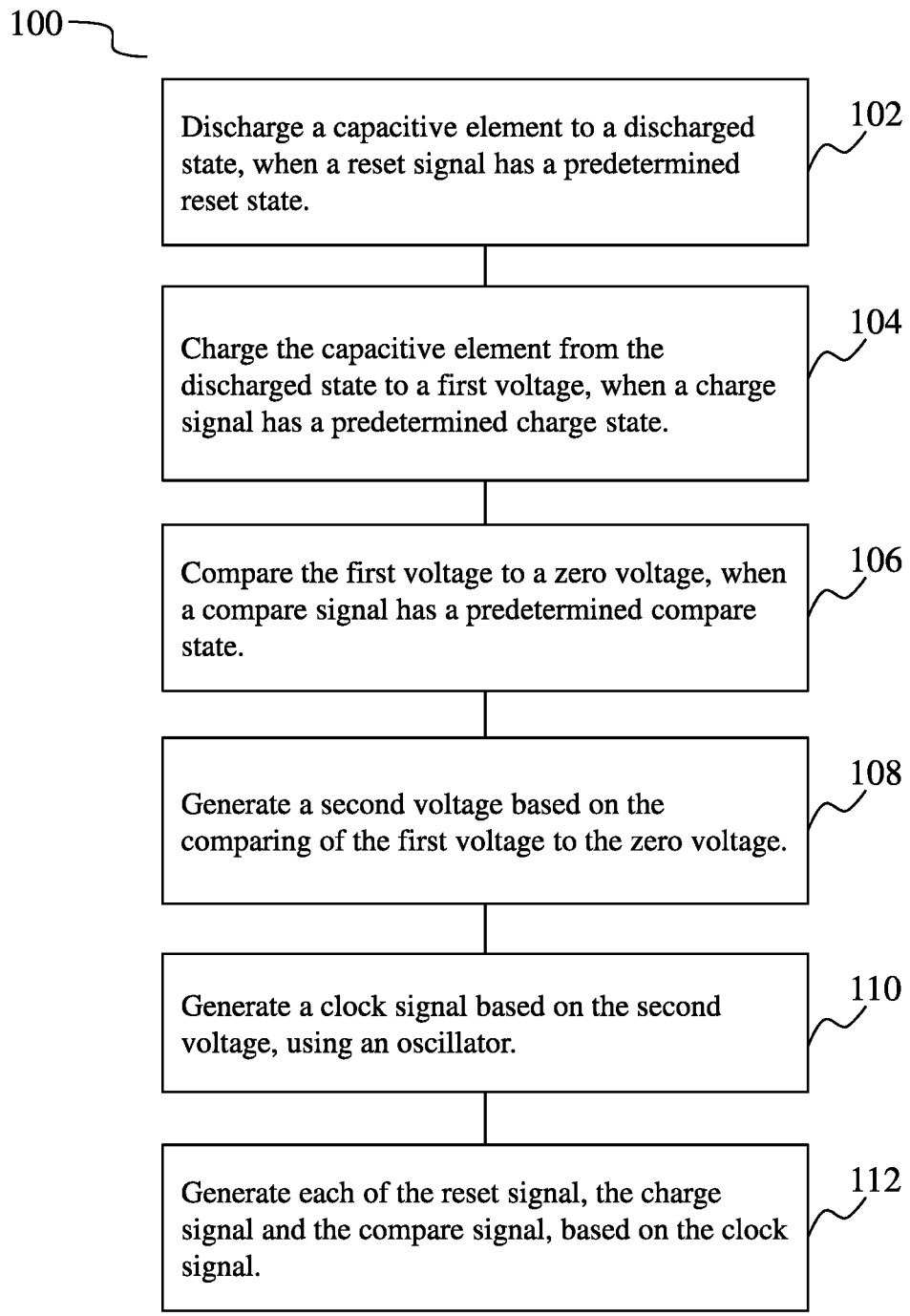
FIG. 1 shows a flow diagram of a method for generating a reference clock signal, according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

In an embodiment, a "circuit" may be understood as any kind of a logic implementing entity, which may be special purpose circuitry or processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In the context of various embodiments, the phrase "reference clock signal generator" may be but is not limited to being interchangeably referred to as a reference clock oscillator or a CMOS oscillator.

In the context of various embodiments, the phrase "zero-voltage charging time" may be but is not limited to being interchangeably referred to as $T_{OV}$.

In the context of various embodiments, the phrase "frequency-to-voltage converter" may be but is not limited to being interchangeably referred to as a period detector.

Low-power Complementary Metal-Oxide Semiconductor (CMOS) reference clock oscillators may be used in miniaturized system-on-chips (SoCs) for emerging microsystems such as implantable biomedical devices and smart sensors, which require low power consumption and small system sizes. In such miniaturized SoCs, the supply voltage may be low while the level of analog and digital circuit integration may be high to meet rigorous power and area constraints. As such, noise from other blocks, especially digital blocks coupled through supply and ground lines, may become a serious threat that degrades the performance of CMOS reference clock oscillators. The reference clock oscillators are also referred herein as reference clock signal generators.

Low-power CMOS reference clock signal generators may be based on relaxation oscillators which may provide frequency stability and low noise. State-of-the-art reference clock signal generators may not have immunity to noise from supply and ground lines, as the state-of-the-art reference clock signal generators may include supply-sensitive building blocks, such as reference voltage generators and single-ended comparators. One solution to overcome the noise from supply and ground lines may be to use large external decoupling capacitors. However, large external decoupling capacitors may not be suitable for applications which need to be small in size and low in cost. Another solution for making the reference clock oscillators immune to supply noise may be to regulate the supply line with a band-gap voltage regulator. However, band-gap voltage regulators tend to be high in power consumption and may also be large in size. Moreover, even with the use of band-gap voltage regulator, decoupling capacitors of several hundreds of nanofarads may still be required to remove high frequency noise, as the power supply rejection ratio of band-gap voltage regulators may start to deteriorate from around tens of kilohertz. Therefore, there is a need for a new reference clock signal generator which can be immune to noise from supply and ground lines, while being suitable for power and area-restricted applications.

FIG. 1 shows a flow diagram 100 showing a method for generating a reference clock signal according to various embodiments. In 102, a capacitive element may be discharged to a discharged state, when a reset signal has a predetermined reset state. In 104, the capacitive element may be charged from the discharged state to a first voltage, when a charge signal has a predetermined charge state. In 106, the first voltage may be compared to a zero voltage, when a compare signal has a predetermined compare state. In 108, a second voltage may be generated based on the comparing of the first voltage to the zero voltage. In 110, a clock signal may be generated based on the second voltage, using an oscillator. In 112, each of the reset signal, the charge signal and the compare signal, may be generated based on the clock signal.

In other words, according to various embodiments, a method for generating a reference clock signal may include discharging a capacitive element to a discharged state when a reset signal has a predetermined reset state, then charging the capacitive element from the discharged state to a first voltage when a charge signal has a predetermined charge state. The method may further include comparing the first voltage and a zero voltage when a compare signal has a predetermined compare state; and generating a second voltage based on the comparison of the first voltage and the zero voltage. The method may further include generating a clock signal based on the second voltage using an oscillator. The method may further include generating based on the clock signal, each one of the reset signal, the charge signal and the compare signal.

Figure 2:
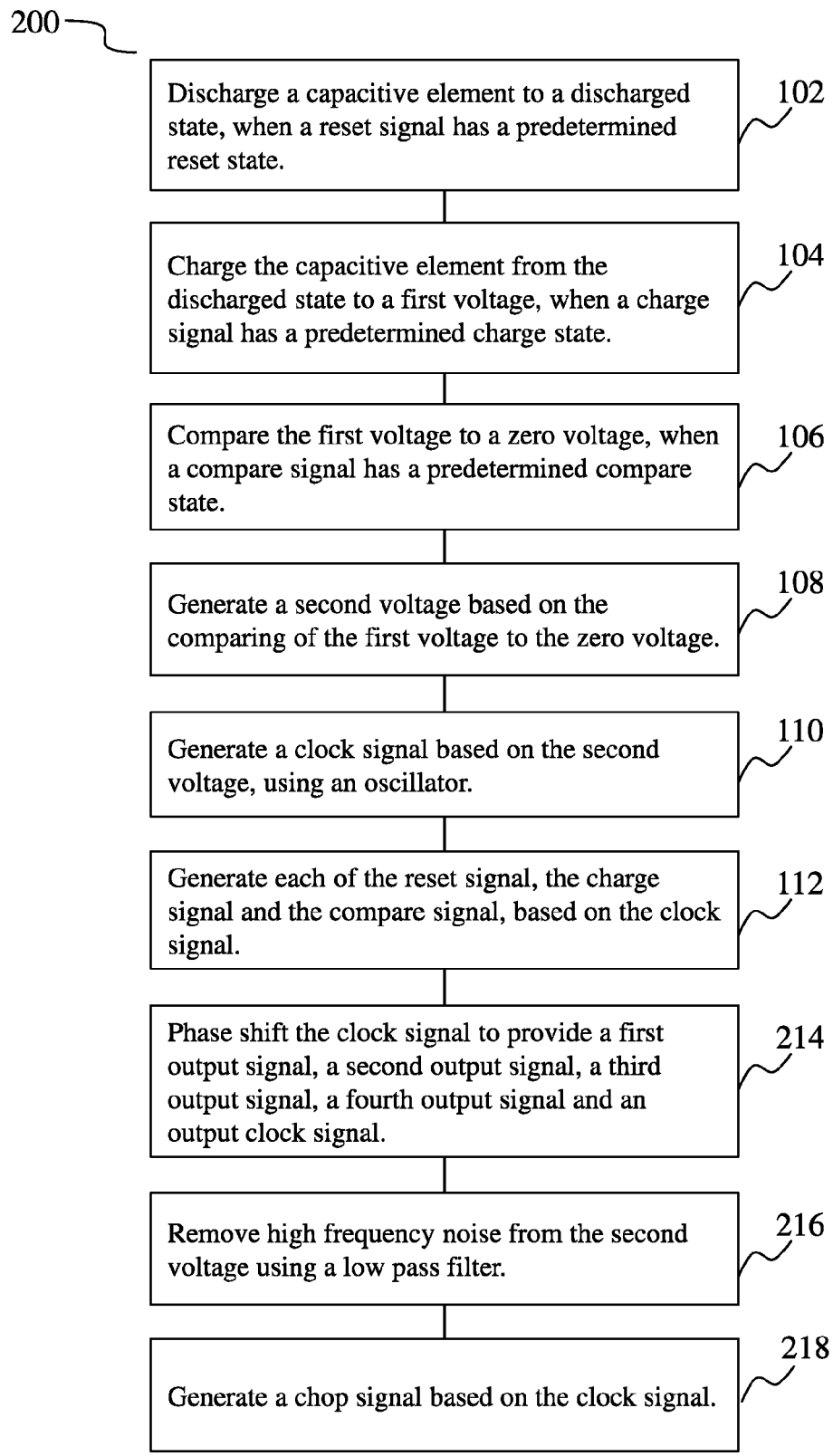
FIG. 2 shows a flow diagram of a method for generating a reference clock signal, according to various embodiments.

FIG. 2 shows a flow diagram 200 showing a method for providing a reference clock according to various embodiments. The method may be similar to the method of FIG. 1, in that the method includes discharging a capacitive element to a discharged state when a rest signal has a predetermined reset state; charging the capacitive element from the discharged state to a first voltage when a charge signal has a predetermined charge state; comparing the first voltage to a zero voltage when a compare signal has a predetermined compare state; generating a second voltage based on the comparing of the first voltage to the zero voltage; generating a clock signal based on the second voltage using an oscillator; and generating each of the first reset signal, the charge signal and the compare signal, based on the clock signal. The method may further include, in addition to the method of FIG. 1, 214 in which the clock signal may be phase shifted to provide a first output signal, a second output signal, a third output signal, a fourth output signal and an output clock signal. The method may further include 216, in which high frequency noise may be removed from the second voltage using a low pass filter. The method may further include 218, in which a chop signal is generated based on the clock signal.

Figure 3:
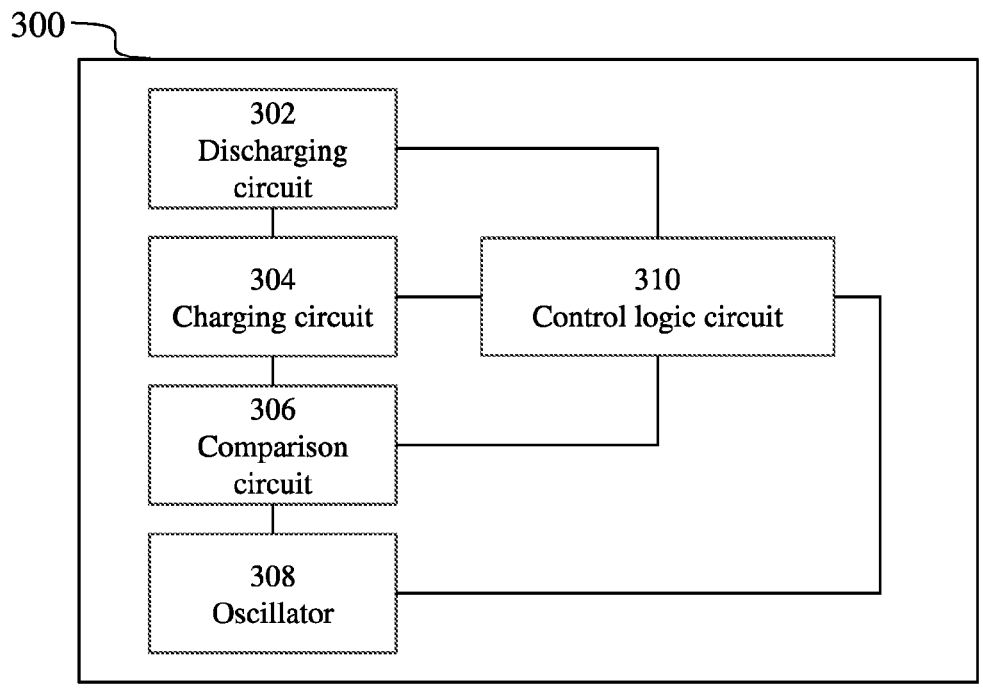
FIG. 3 shows a conceptual diagram of a reference clock signal generator according to various embodiments.

FIG. 3 shows a conceptual diagram of a reference clock signal generator 300, according to various embodiments. The reference clock signal generator 300 may include a discharging circuit 302, a charging circuit 304, a comparison circuit 306, an oscillator 308 and a control logic circuit 310. The discharging circuit 302 may be configured to discharge a capacitive element to a discharged state when a reset signal has a predetermined reset state. The capacitive element may be an electrical component configured to hold a charge, for example, a capacitor. The charging circuit 304 may be configured to charge the capacitive element from the discharged state to a first voltage when a charge signal has a predetermined charge state. The charging circuit 304 may include the capacitive element and at least one resistive element. At least one of the discharging circuit 302 or the charging circuit 304 may include a differential frequency-to-voltage converter (FVC). Both the discharging circuit 302 and the charging circuit 304 may be coupled to a common supply voltage $V_{DD}$, through the same supply and ground lines. The comparison circuit 306 may be configured to compare the first voltage to a zero voltage when a compare signal has a predetermined compare state and may be further configured to generate a second voltage based on the comparing of the first voltage to the zero voltage. The comparison circuit 306 may include a differential integrator which may include an operational amplifier. The operational amplifier may be connected to a negative feedback loop. The operational amplifier may have input terminals configured to provide a reference for the zero voltage. The oscillator 308 may be configured to generate a clock signal based on the second voltage. The oscillator 308 may include a voltage-controlled oscillator (VCO). The control logic circuit 310 may be configured to generate each of the reset signal, the charge signal and the compare signal, based on the clock signal. The control logic circuit 310 may include a plurality of logic gates, including NAND gates. The control logic circuit 310 may also include frequency dividers.

Figure 4:
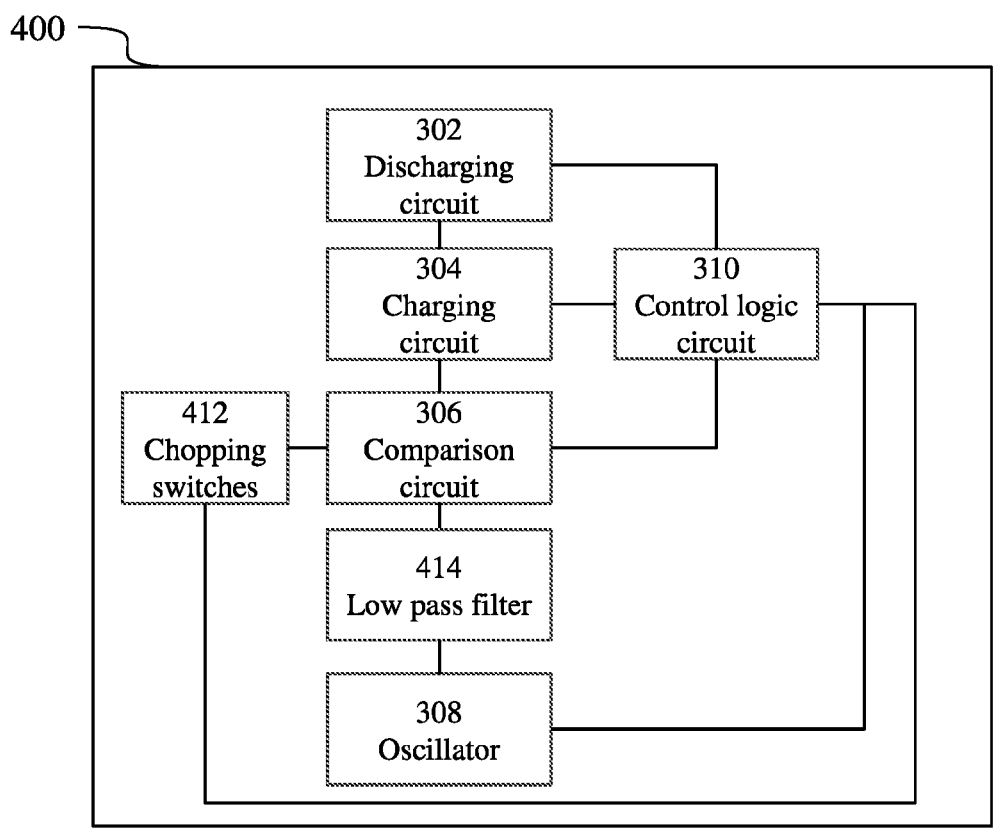
FIG. 4 shows a conceptual diagram of a reference clock signal generator according to various embodiments.

FIG. 4 shows a conceptual diagram of a reference clock signal generator 400, according to various embodiments. The reference clock signal generator 400 may include a discharging circuit 302, a charging circuit 304, a comparison circuit 306, an oscillator 308 and a control logic circuit 310, like the reference clock signal generator 300 of FIG. 3. In addition, the reference clock signal generator 400 may further include a plurality of chopping switches 412 and a low pass filter 414. The plurality of chopping switches 412 may be coupled to the comparison circuit 306. The plurality of chopping switches 412 may be configured to be operated by a chop signal, the chop signal being dependent on the clock signal generated by the oscillator 308. The plurality of chopping switches 412 may be electronic switches configured to interrupt one signal under the control of another. The plurality of chopping switches 412 may be configured to convert a fixed direct current (DC) input to a variable DC output voltage directly. The plurality of chopping switches 412 may stabilize the reference clock signal generator 400 against drift in electronic components. The plurality of chopping switches 412 may be used to reduce phase noise of the reference clock signal generator 400. The plurality of chopping switches 412 may modulate a received signal which includes low frequency noise. The modulated signal may be amplified and then demodulated by the plurality of chopping switches 412, so that the low frequency noise is modulated to the harmonics of a frequency of the chop signal. The modulated low frequency noise may appear as a chopper ripple in an output of the chopping switches 412. The output of the chopping switches 412 may be provided to the low pass filter 414 which can be configured to remove the modulated noise, to provide a filtered voltage to the oscillator 308.

According to various embodiments, an output frequency of a reference clock signal generator may have low sensitivity to supply variation. The reference clock signal generator may include a reference resistive element, $R_{ref}$ which may have a low temperature coefficient so that the resistance of $R_{ref}$ may be robust to temperature variations. A resistive element having a low temperature coefficient may be achieved by combining poly-silicon resistors and diffused resistors with opposite temperature coefficients. The resistive element may include a first resistor and a second resistor, wherein the temperature coefficient of the second resistor may be opposite the temperature coefficient of the first resistor.

According to various embodiments, a reference clock signal generator may include chopping switches and a low pass filter to achieve a low noise operation. The reference clock signal generator may include a differential operational amplifier. The differential operational amplifier may contribute noise, commonly known as flicker noise, or also referred to as 1/f noise. In order to reduce the noise from the opamp, the reference clock signal generator may employ a chopping technique using the chopping switches. The low pass filter may be used to filter out high frequency noise generated by the chopping switches.

According to various embodiments, a method for generating a reference clock signal may include an iteration of three phases, namely a reset phase, a conversion phase and a comparison phase. The reset phase may be followed by the conversion phase which may in turn, be followed by the comparison phase. The conversion phase may also be referred to herein, as the charging phase.

A reference clock signal generator according to various embodiments, may be a low power CMOS oscillator with high supply and ground noise rejection. The CMOS oscillator may employ a fully differential supply and ground regulated frequency-locked loop (FLL) scheme composed of a supply and temperature insensitive frequency-to-voltage converter (FVC) and a differential integrator. The CMOS oscillator may be able to reject supply and ground noise without using any decoupling capacitors or band-gap regulators. The CMOS oscillator may also employ a chopping technique to achieve a lower phase noise.

A reference clock signal generator according to various embodiments may include a fully differential supply and ground regulated FLL architecture, a supply and temperature insensitive differential FVC, and a virtual zero voltage as a reference voltage.

Figure 5:
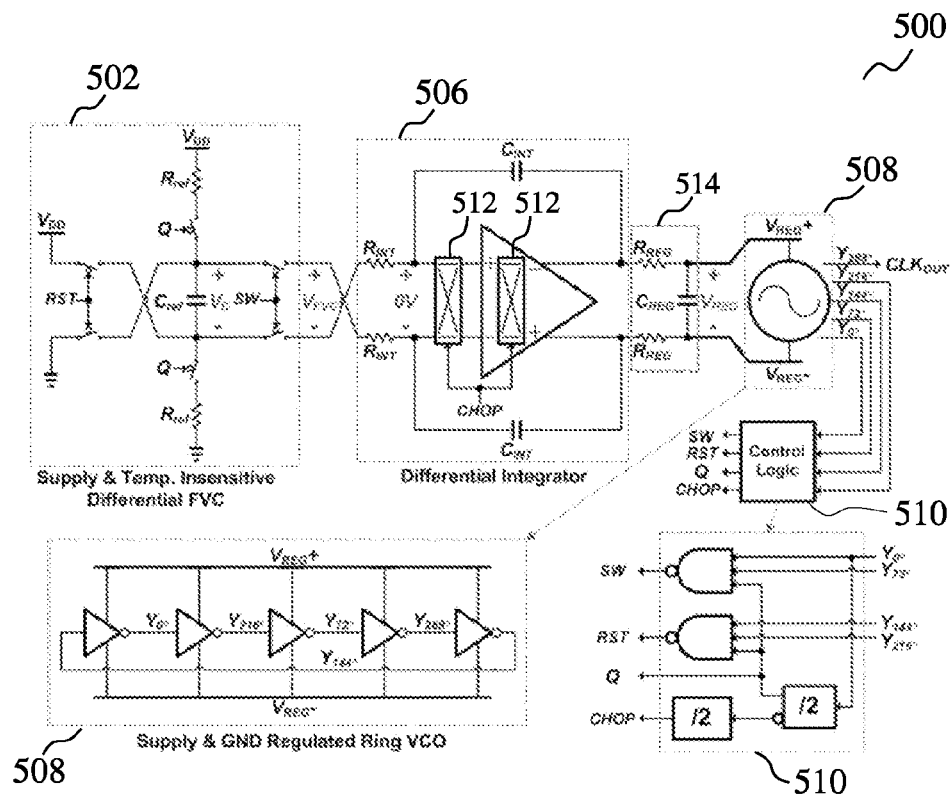
FIG. 5 shows a reference clock signal generator according to various embodiments.

FIG. 5 shows a circuit schematic diagram of a reference clock signal generator 500, according to various embodiments. The reference clock signal generator 500 may include a frequency-to-voltage converter (FVC) 502, a differential integrator 506, an oscillator 508, a control logic circuit 510, a plurality of chopping switches 512 and a low pass filter 514. The FVC 502 may also be referred herein as a period detector (PD).

The FVC 502 may include the discharging circuit 302 and the charging circuit 304 of FIGS. 3 and 4. The FVC 502 may be insensitive to variations in a supply voltage $V_{DD}$ and variations in temperature within and outside of the reference clock signal generator 500. The FVC 502 may include a plurality of reset switches which may be configured to be operable by a reset signal RST. The plurality of reset switches may be connected to the supply voltage $V_{DD}$ and ground. The FVC 502 may further include a plurality of reference resistors $R_{ref}$ connected to the supply voltage $V_{DD}$ and ground. The reference resistors $R_{ref}$ may be connected to a reference capacitor $C_{ref}$ in series. $C_{ref}$ may have its positive end connected to the reset switch which may be connected to ground; and $C_{ref}$ may have its negative end connected to $V_{DD}$. The reference resistors $R_{ref}$ may also be coupled to a plurality of charge switches configured to be operable by a charge signal Q. The FVC 502 may further include a plurality of compare switches having one end connected to the reference capacitor $C_{ref}$ and a further end connected to the differential integrator 506 such that a voltage across $C_{ref}$ may be provided to the differential integrator 506 when the plurality of compare switches are closed. The positive end of $C_{ref}$ may be connected to the negative input of the differential integrator 506 via the compare switch while the negative end of $C_{ref}$ may be connected to the positive input of the differential integrator 506 via the compare switch. The plurality of compare switches may be configured to be operable by a compare signal SW.

The differential integrator 506 may be similar in function to the comparison circuit 306 of FIGS. 3 and 4. The differential integrator 506 may be coupled to the FVC 502 for receiving an output of the FVC 502. The differential integrator 506 may include an operational amplifier (opamp) connected in a negative feedback loop. The differential integrator 506 may further include a plurality of chopping switches 512 which may be configured to be operable by a chop signal CHOP. The plurality of chopping switches 512 may be the same as the chopping switches 412 of FIG. 4. The voltage output of the FVC 502, denoted as $V_{FVC}$, may be connected to the opamp of the differential integrator 506, in reverse polarity, such that a negative input terminal of the opamp receives a first voltage and a positive input terminal of the opamp receives a second voltage, wherein the first voltage may be less positive than the second voltage. The negative feedback loop of the opamp may include at least one capacitor, denoted as $C_{INT}$ in FIG. 5.

The low pass filter 514 may be similar in function to the low pass filter 414 of FIG. 4. The low pass filter 514 may be configured to receive the output of the differential integrator 506. The low pass filter 514 may include a resistor $R_{REG}$ and a capacitor $C_{REG}$. The resistor $R_{REG}$ and the capacitor $C_{REG}$ may be connected in parallel. The low pass filter 514 may remove high frequency noise from the output voltage of the differential integrator 506, to provide a regulated voltage $V_{REG}$. The high frequency noise may be caused by the plurality of chopping switches 512.

The oscillator 508 may be similar in function to the oscillator 308 of FIGS. 3 and 4. The oscillator 508 may be arranged to receive the regulated voltage $V_{REG}$ from the low pass filter 514. The oscillator 508 may be a voltage-controlled oscillator (VCO), in other words, a frequency of the clock signal generated by the oscillator 508 may depend on the voltage received by the oscillator 508. The oscillator 508 may be configured to generate a clock signal based on the regulated output voltage $V_{REG}$. The clock signal may be phase-shifted to provide a plurality of output signals. The clock signal may include the plurality of output signals. Each output signal may be phase-shifted from the clock signal by different multiples of a phase shift constant, respectively. For example, the plurality of output signals may include five output signals, each of which may be phase-shifted by a fifth of a full cycle, i.e. the phase shift constant is 72°, such that a first output signal is $Y_{0°}$, a second output signal is $Y_{72°}$, a third signal is $Y_{144°}$, a fourth signal is $Y_{216°}$ and a fifth signal is $Y_{288°}$, where $Y_{n°}$ denotes the clock signal phase-shifted by n°. One output signal of the plurality of output signals may be used as the output clock signal of the reference clock signal generator 500.

The oscillator 508 may be a supply-regulated and ground-regulated ring voltage controlled oscillator. The oscillator 508 may include a plurality of inverting delay cells, for example five inverting delay cells as shown in FIG. 5. The voltage between the supply and ground of the oscillator 508 may be used as its power as well as its control voltage. Therefore, the output frequency of the oscillator 508 may be controlled by $V_{REG}$.

The control logic circuit 510 may be similar in function to the control logic circuit 310 of FIGS. 3 and 4. The plurality of output signals may be provided to the control logic circuit 510 which may be configured to generate each of the reset signal RST, the compare signal SW, the charge signal Q and the chop signal CHOP, based on the clock signal. The control logic circuit 510 may include a first NAND gate arranged to receive the first output signal $Y_{0°}$, the second output signal $Y_{72°}$ and the charge signal Q; a second NAND gate arranged to receive the third output signal $Y_{144°}$, the fourth output signal $Y_{216°}$ and the charge signal Q; a first divider arranged to receive the first output signal $Y_{0°}$ and a second divider arranged to receive the charge signal Q. The first NAND gate may be configured to provide the compare signal SW, based on the first output signal $Y_{0°}$, the second output signal $Y_{72°}$ and the charge signal Q. The compare signal SW may be generated by providing the first output signal $Y_{0°}$, the second output signal $Y_{72°}$ and the charge signal Q to the first NAND gate. The second NAND gate may be configured to provide the reset signal RST based on the third output signal $Y_{144°}$, the fourth output signal $Y_{216°}$ and the charge signal Q. The reset signal RST may be generated by providing the third output signal $Y_{144°}$, the fourth output signal $Y_{216°}$ and the charge signal Q to the second NAND gate. The first divider may be configured to provide the charge signal Q based on the first output signal $Y_{0°}$. A frequency of the charge signal Q may be a fraction or a multiple of a frequency of the clock signal. The second divider may be configured to provide the chop signal based on the charge signal Q. The chop signal CHOP may also be generated by dividing the clock signal. A frequency of the chop signal CHOP may be a fraction or a multiple of the frequency of the clock signal.

The reference clock signal generator 500 may employ a frequency locked loop around the oscillator 508. The oscillator 508 may be a supply and ground regulated VCO, so that its output frequency is locked to a zero voltage caused by a virtual short of the differential integrator 506. The zero voltage may be a virtual zero voltage at input terminals of the opamp of the differential integrator 506. The opamp may be connected to a negative feedback loop. The zero voltage provided at the inputs of the differential integrator 506 may be insensitive to variations in process, voltage and temperature (PVT).

Figure 6:
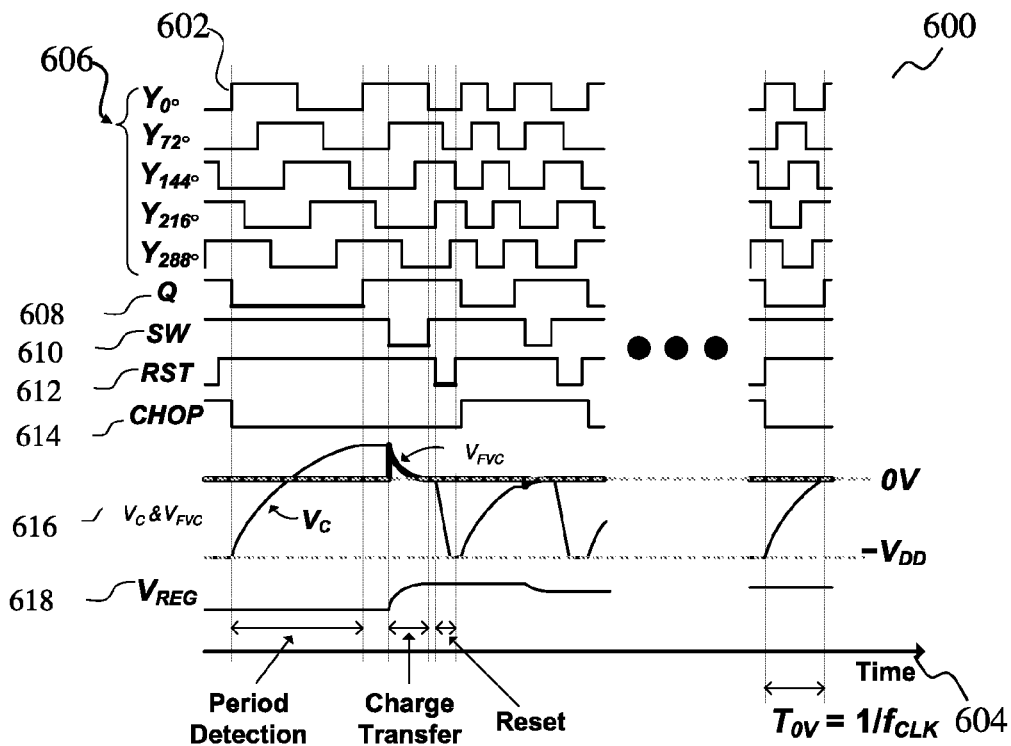
FIG. 6 shows a graph showing a plurality of control signals and analog voltages with respect to time.

FIG. 6 shows a graph 600 having a vertical axis 602 and a horizontal axis 604. The horizontal axis 604 indicates time. In graph 600, the outputs of the VCO 606 ($Y_{0°}$, $Y_{72°}$, $Y_{144°}$, $Y_{216°}$, $Y_{288°}$ are shown together with a plurality of control signals—charge signal Q 608, compare signal SW 610, reset signal RST 612 and chop signal CHOP 614; the analog voltage of the reference capacitor, denoted as $V_C$ 616; the analog voltage of the FVC output, denoted as $V_{FVC}$ and the analog voltage of the VCO supply, denoted as $V_{REG}$ 618. The control signals may be generated from the simple logics shown in the control logic circuit 510 of FIG. 5. The operation may include a reset phase, a frequency-to-voltage conversion phase and a voltage comparison phase. During the reset phase when RST 612 is low, the capacitor $C_{ref}$ may be discharged to a discharged state. $C_{ref}$ may be in a discharged state when a voltage across $C_{ref}$ is a negative value of the supply voltage, i.e. i.e., $V_C=-V_{DD}$. Next, during the frequency conversion phase when Q 608 is low, $C_{ref}$ may be charged to a first voltage by $R_{ref}$ which may be coupled to the supply voltage $V_{DD}$. Q 608 may be generated by dividing the output of the oscillator, also referred herein as the clock signal, by two. Therefore, $V_C$ 616 at the end of the conversion phase represents the output frequency. Next, when SW 610 is low, $V_{FVC}$ may be compared to 0V through the differential integrator which may transfer charge on $C_{ref}$ to $C_{INT}$ and changes $V_{REG}$ 618. Due to the negative feedback formed by the frequency locked loop, $V_C$ 616 at the end of the conversion phase may eventually reach 0V (i.e., there is no charge transfer between $C_{ref}$ and $C_{INT}$) and the desired frequency may be locked to the time taken for $C_{ref}$ to be charged from $-V_{DD}$ to zero volts. Therefore, during the steady-state, the output frequency of clock signal generated by the reference clock signal generator may be represented as Equation (1):

$$f_{CLK} = \frac{1}{ZVCT} = \frac{1}{2R_{ref}C_{ref}\ln(2)} \quad (1)$$

In other words, FIG. 6 shows the timing diagram and waveforms of a reference clock signal generator, according to various embodiments. The periodic operation of the reference clock signal generator may include a reset phase, a period-detection phase and a charge-transfer phase. During the reset phase, RST 612 may be low and $C_{ref}$ may be discharged to $-V_{DD}$ $V_C=-V_{DD}$). Next, in the period-detection phase, Q may be low and $C_{ref}$ may be charged through two reference resistors, each having a value of $R_{ref}$. As Q 608 may be the output of the oscillator divided by two, $V_C$ 616 at the end of this phase represents the period difference between $1/f_{CLK}$ and the ZVCT. After that, when SW 610 goes low, a voltage output of the FVC, i.e. $V_{FVC}$ may be updated by sampling $V_C$ and compared with 0V through the differential integrator which transfers the charge on $C_{ref}$ to $C_{INT}$ and changes $V_{REG}$ 618. Due to the negative feedback formed by the frequency-locked loop, $V_{FVC}$ at the charge-transfer phase reaches 0V eventually and the output clock is finally locked at the ZVCT. As can be seen in equation (1), the time taken to charge $C_{ref}$ from the discharged state to zero voltage, also referred herein as ZVCT, may be dependent on capacitance of the reference capacitor $C_{ref}$ and resistance of the reference resistor $R_{ref}$. Frequency of the clock signal, $f_{CLK}$, may be dependent on the ZVCT. Therefore, the output frequency after locking may be independent of supply variation as desired.

Figure 7A:
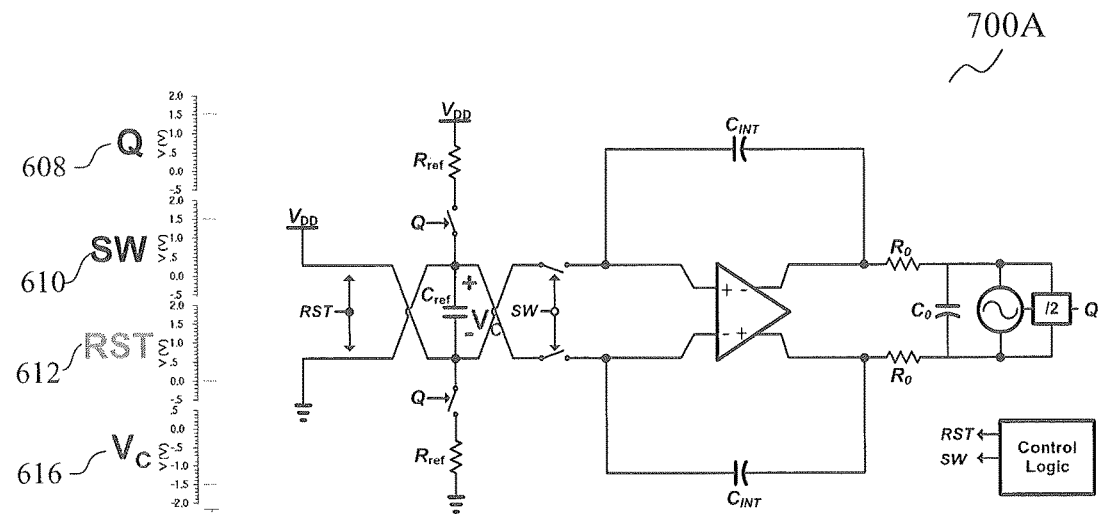
FIG. 7A shows a reference clock signal generator according to various embodiments, operating in a reset phase.

FIG. 7A shows a diagram 700A showing a reference clock signal generator in a reset phase, according to various embodiments. The diagram 700A shows the state of each of the control signals Q 608, SW 610, RST 612 and the analog voltage across the reference capacitor, $V_C$ 616. During the reset phase, RST 612 may be low while the other control signals Q 608 and SW 610 may be high. The low RST 612 may be the predetermined state for which the plurality of reset switches is closed. During the reset phase, the plurality of reset switches may be closed and the plurality of charge switches may be open. $C_{ref}$ may be discharged, eventually to $-V_{DD}$, in other words, $V_C=-V_{DD}$.

Figure 7B:
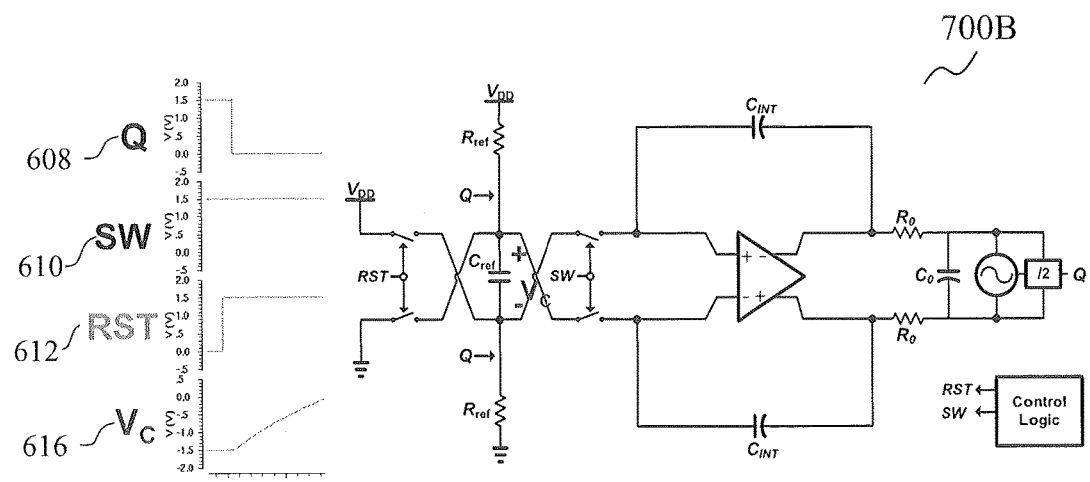
FIG. 7B shows a reference clock signal generator according to various embodiments, operating in a charging phase.

FIG. 7B shows a diagram 700B showing a reference clock signal generator in a charging phase, according to various embodiments. The diagram 700B shows the state of each of the control signals Q 608, SW 610, RST 612 and the analog voltage across the reference capacitor, $V_C$ 616. During the charging phase, Q 608 may be low while the other control signals RST 612 and SW 610 may be high. The low Q 608 may be the predetermined state for which the plurality of charge switches is closed. During the charging phase, the plurality of charge switches may be closed and the plurality of reset switches may be open. $C_{ref}$ may be charged such that $C_{ref}$ holds the voltage $V_C$ 616.

Figure 7C:
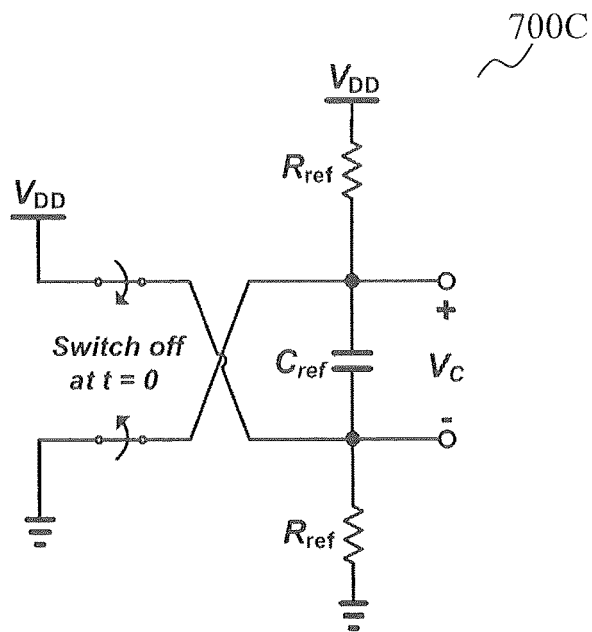
FIG. 7C shows a resistor-capacitor circuit according to various embodiments.

FIG. 7C shows a circuit diagram 700C showing a charging circuit and a discharging circuit, according to various embodiments. When the plurality of reset switches are closed and the plurality of charge switches are open, $C_{ref}$ may be discharged, eventually to $-V_{DD}$, in other words, $V_C=-V_{DD}$. When the pluralities of reset switches are opened and the plurality of charge switches are closed, $C_{ref}$ may be charged such that $C_{ref}$ holds the voltage $V_C$.

Figure 7D:
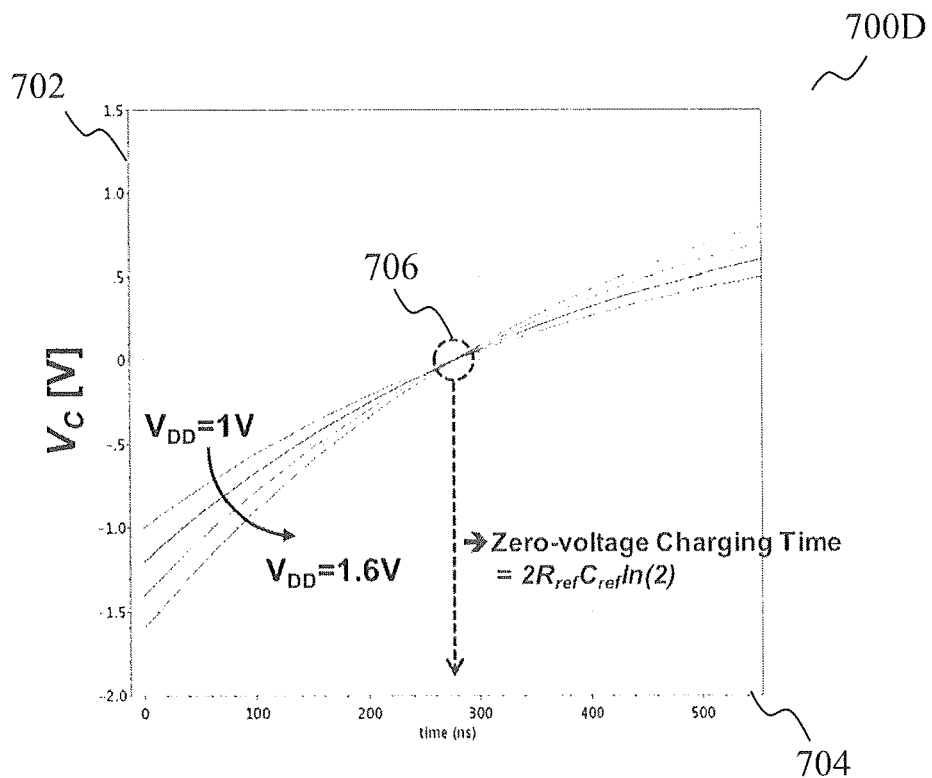
FIG. 7D shows a graph showing a zero-voltage charging time of the resistor-circuit of FIG. 7C.

FIG. 7D shows a graph 700D having a vertical axis 702 and a horizontal axis 704. The vertical axis 702 indicates the voltage across the reference capacitor $C_{ref}$ of FIG. 5. The horizontal axis 704 indicates time in nanoseconds. The graph 700D includes four plots, each plot corresponding to a different $V_{DD}$ value, ranging from $V_{DD}=1V$ to $V_{DD}=1.6V$. As shown in FIG. 7D, the time taken to charge $C_{ref}$ to from $-V_{DD}$ to zero volts, i.e. the zero-voltage charging time (ZVCT) 706, is the same regardless of the value of $V_{DD}$. As such, the ZVCT 706 is immune to supply noise and ground noise. A reference clock signal generator may make use of the ZVCT to calibrate the output clock signal frequency, since the ZVCT 706 is independent of supply variation.

Figure 8A:
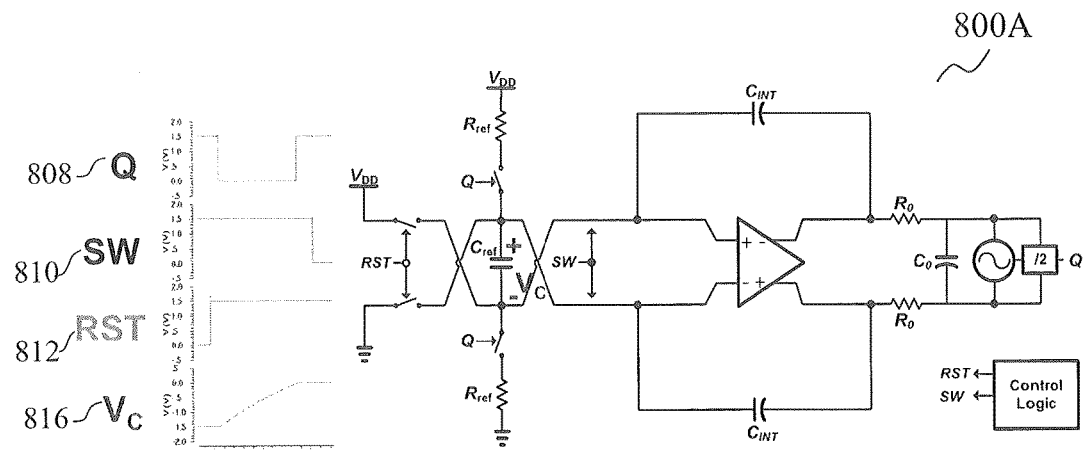
FIG. 8A shows a reference clock signal generator according to various embodiments, operating in a compare phase.

FIG. 8A shows a diagram 800A showing a reference clock signal generator in a comparing phase, according to various embodiments. The diagram 800A shows the state of each of a plurality of control signals Q 808, SW 810, RST 812 and the analog voltage across the reference capacitor, $V_C$ 816 during the comparing phase. During the charging phase, SW 810 may be low while the other control signals RST 812 and Q 808 may be high. The low SW 810 may be the predetermined state for which the plurality of compare switches is closed. During the comparing phase, the plurality of compare switches may be closed while the plurality of reset switches and the plurality of charge switches may be open. With the compare switches closed, the output voltage of the FVC, $V_{FVC}=V_C$. The voltage at the positive polarity of $C_{ref}$ may be provided to the negative input terminal of the differential integrator while the voltage at the negative polarity of $C_{ref}$ may be provided to the positive input terminal of the differential integrator. During the compare phase, the frequency of the clock signal may be converted to a voltage by the FVC as $V_{FVC}$ is compared to a virtual zero voltage at the input terminals of the differential integrator.

Figure 8B:
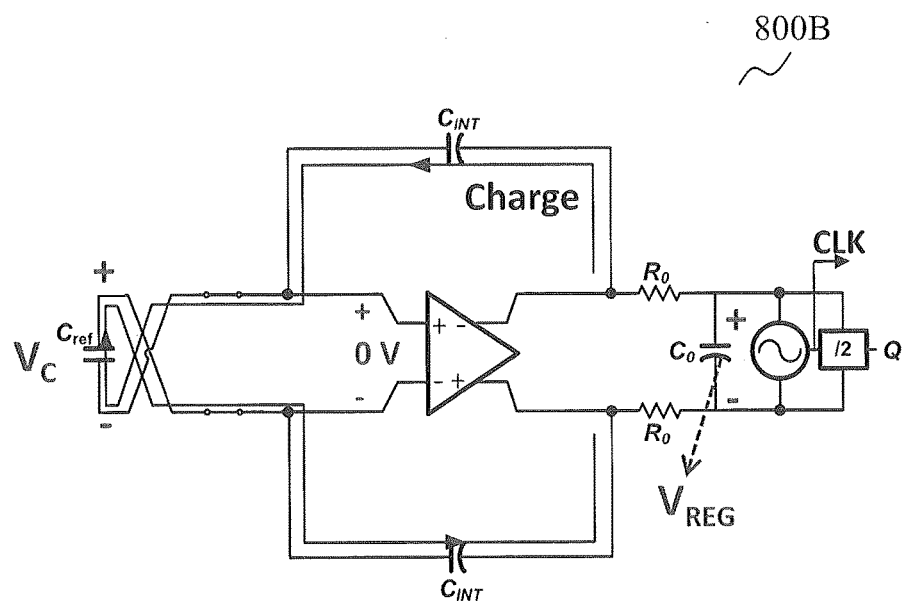
FIG. 8B shows a reference clock signal generator according to various embodiments, when an output period is longer than the zero-voltage charging time.

FIG. 8B shows a diagram 800B showing a reference clock signal generator, according to various embodiments, when a period of the output clock signal is longer than the ZVCT. When the period of the output clock signal is longer than the ZVCT, $C_{ref}$ may be charged to a positive voltage, i.e. a voltage that is larger than the virtual zero voltage provided by the differential integrator. As such, charge may be transferred from $C_{ref}$ to the differential integrator, until $V_C$ is zero volts. The output voltage of the differential integrator, $V_{REG}$ may increase as a result. The increased $V_{REG}$, in turn, may cause the voltage-controlled oscillator to increase the frequency of the output clock signal.

Figure 8C:
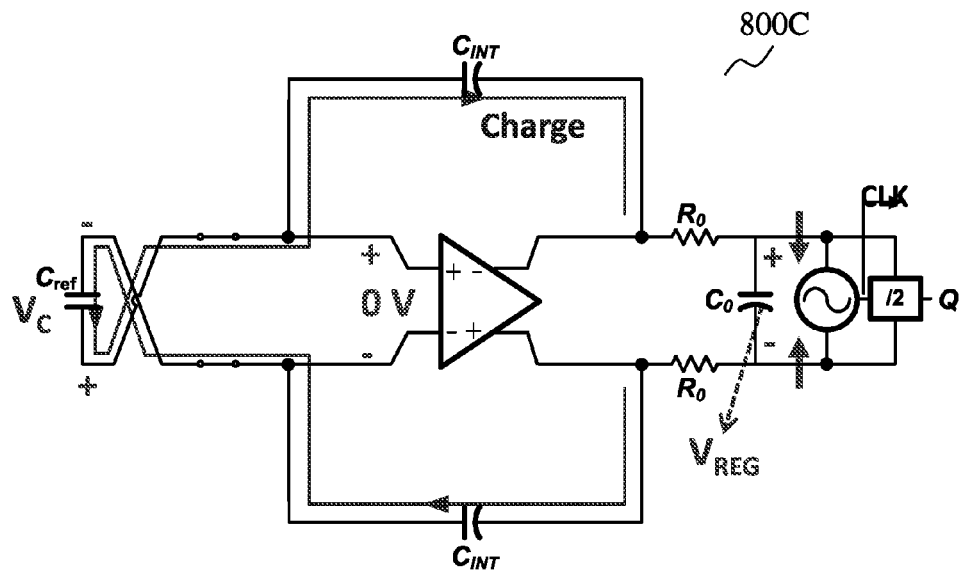
FIG. 8C shows a reference clock signal generator according to various embodiments, when an output period is shorter than the zero-voltage charging time.

FIG. 8C shows a diagram 800C showing a reference clock signal generator, according to various embodiments, when a period of the output clock signal is shorter than the ZVCT. When the period of the output clock signal is shorter than the ZVCT, $C_{ref}$ may be charged to a negative voltage, i.e. a voltage that is less than the virtual zero voltage provided by the differential integrator. As such, charge may be transferred from the differential integrator towards $C_{ref}$ until $V_C$ is zero volts. The output voltage of the differential integrator, $V_{REG}$ may decrease as a result. The decreased $V_{REG}$, in turn, may cause the voltage-controlled oscillator to decrease the frequency of the output clock signal.

Figure 8D:
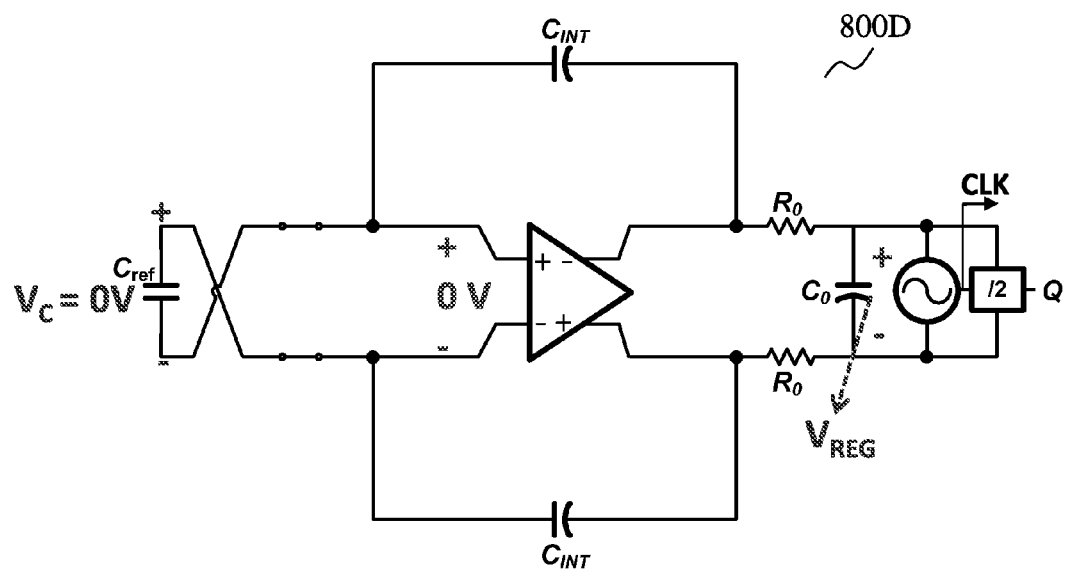
FIG. 8D shows a reference clock signal generator according to various embodiments, when an output period is at least substantially equal to the zero-voltage charging time.

FIG. 8D shows a diagram 800D showing a reference clock signal generator, according to various embodiments, when a period of the output clock signal is at least substantially equal to the ZVCT. When the period of the output clock signal is at least substantially equal to the ZVCT, there may be no charge transfer between $C_{ref}$ and the differential integrator. Therefore, $V_{REG}$ may remain constant and the voltage-controlled oscillator may, in turn, maintain the frequency of the output clock signal. Under such a scenario, the output frequency of the reference clock signal generator may be locked to the inverse of the ZVCT. As the ZVCT may be insensitive to supply variation, the frequency of the output clock signal may also be constant regardless of noise in the supply.

Figure 9:
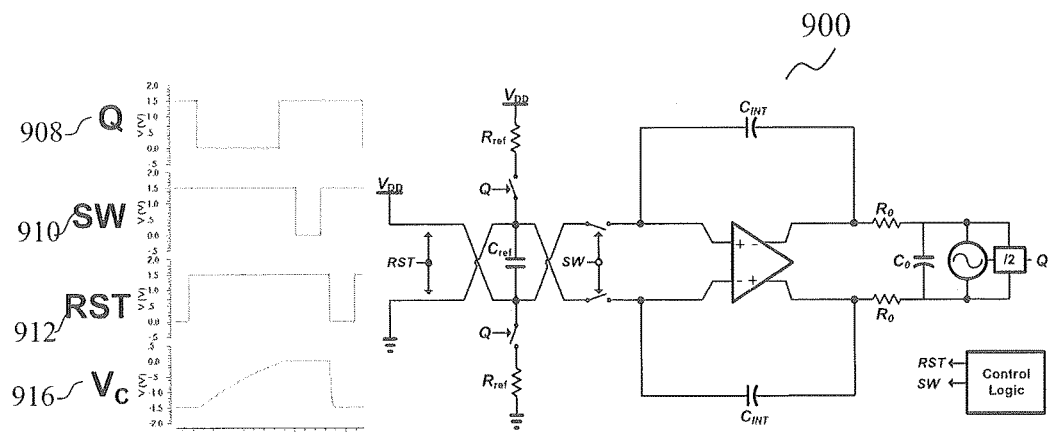
FIG. 9 shows a reference clock signal generator according to various embodiments, operating in a reset phase.

FIG. 9 shows a diagram 900 showing a reference clock signal generator in a reset phase, according to various embodiments. The reference clock signal generator may return to the reset phase, after the comparison phase. The diagram 900 shows the state of each of the control signals Q 908, SW 910, RST 912 and the analog voltage across the reference capacitor, $V_C$ 916. During the reset phase, RST 912 may be low while the other control signals, Q 908 and SW 910 may be high. The low RST 912 may be the predetermined state for which the plurality of reset switches is closed. During the reset phase, the plurality of reset switches may be closed and the plurality of charge switches may be open.

Figure 10:
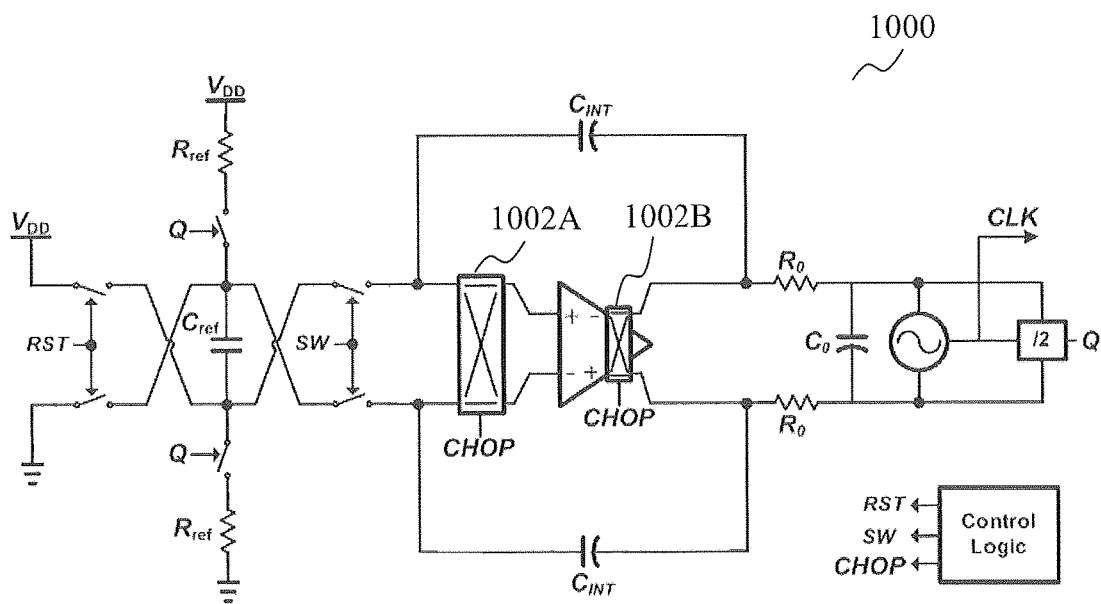
FIG. 10 shows a reference clock signal generator according to various embodiments.

FIG. 10 shows a reference clock signal generator 1000, according to various embodiments. The reference clock signal generator 1000 may include a first chopping switch 1002A and a second chopping switch 1002B. The first chopping switch 1002A may be coupled to inputs of an operational amplifier while the second chopping switch 1002B may be coupled to outputs of the operational amplifier. The first chopping switch 1002A may be configured to receive an input signal. The input signal can be $V_C$ when a plurality of compare switches are at a predetermined state. The first chopping switch 1002A may convert $V_C$ to a modulated signal at a chopping frequency. The modulated signal may be a square wave voltage having a frequency equal to the chopping frequency. The operational amplifier may amplify the modulated signal with an input offset. The second chopping switch 1002B may demodulate the amplified modulated signal and at the same time, modulate the input offset to the odd harmonics of the chopping frequency. The reference clock generator 1000 may further include a low pass filter to remove the modulated offsets. Through the process of modulating the input signal, amplifying the modulated input signal, demodulating the amplified modulated signal and filtering the demodulated signal using a low pass filter, low frequency errors within the input signal can be removed. The low frequency noise present in the input signal may include 1/f noise and drift. The chopping frequency may be higher than the 1/f noise corner frequency, so as to completely remove the 1/f noise.

In the following, a simulation of a reference clock signal generator according to various embodiments will be described.

Figure 11:
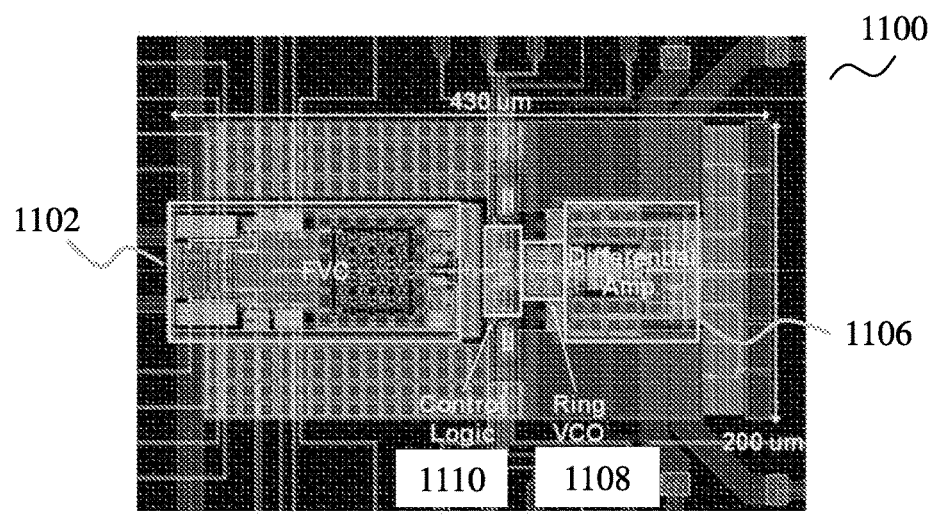
FIG. 11 shows a CMOS reference clock signal generator according to various embodiments.

FIG. 11 shows a reference clock signal generator 1100 according to various embodiments. The reference clock signal generator 1100, including a FVC 1102, a differential amplifier 1106, a ring voltage controlled oscillator 1108 and a control logic circuit 1110, may be fabricated in a 0.18 µm standard CMOS process technology, where the threshold voltage for nMOS and pMOS at saturation region are 0.45V and 0.47V, respectively. The area of reference clock signal generator 1100 may be about 430×200 µm². The reference clock signal generator 1100 may not require any decoupling capacitors or band-gap regulators. The reference clock signal generator 1100 may consume 37 uW from a 1.2V supply. The operation of the reference clock signal generator 1100 may be verified using Spectre simulation in a 0.18 um standard CMOS process with a 1.5V power supply.

Figure 12A:
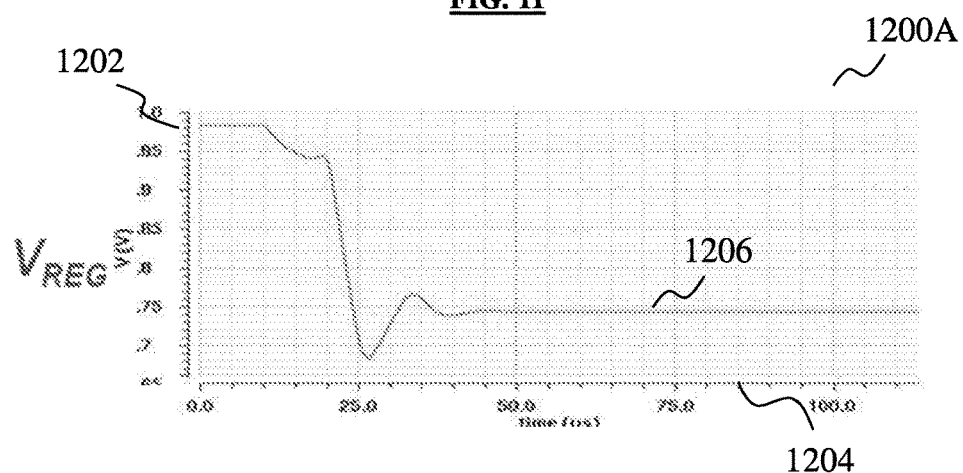
FIG. 12A shows a graph of regulated voltage plotted against time.

FIG. 12A shows a graph 1200A having a vertical axis 1202 and a horizontal axis 1204. The vertical axis 1202 indicates the regulated voltage $V_{REG}$ in volts, while the horizontal axis 1204 indicates the time in micro-seconds. The graph 1200A shows the change in $V_{REG}$ across time in the simulation. The regulated voltage $V_{REG}$ may be the voltage supplied to the ring voltage controlled oscillator 1108 of FIG. 11.

Figure 12B:
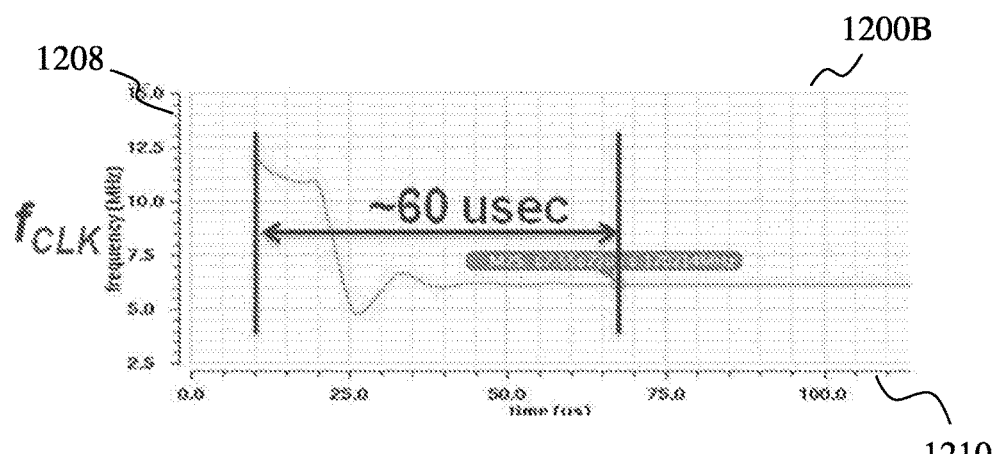
FIG. 12B shows a graph of output frequency plotted against time.

FIG. 12B shows a graph 1200B having a vertical axis 1208 and a horizontal axis 1210. The vertical axis 1208 indicates the frequency of the clock signal $f_{CLK}$ in megahertz, while the horizontal axis 1210 indicates the time in micro-seconds. The graph 1200B shows the change in $f_{CLK}$ across time in the simulation. The clock signal may be generated by the ring voltage controlled oscillator 1108 of FIG. 1, based on the regulated voltage. As shown in FIG.

12B, the reference clock signal generator 1100 requires a locking time of about 60 usec and has an oscillation frequency of about 6.17 MHz.

Figure 13A:
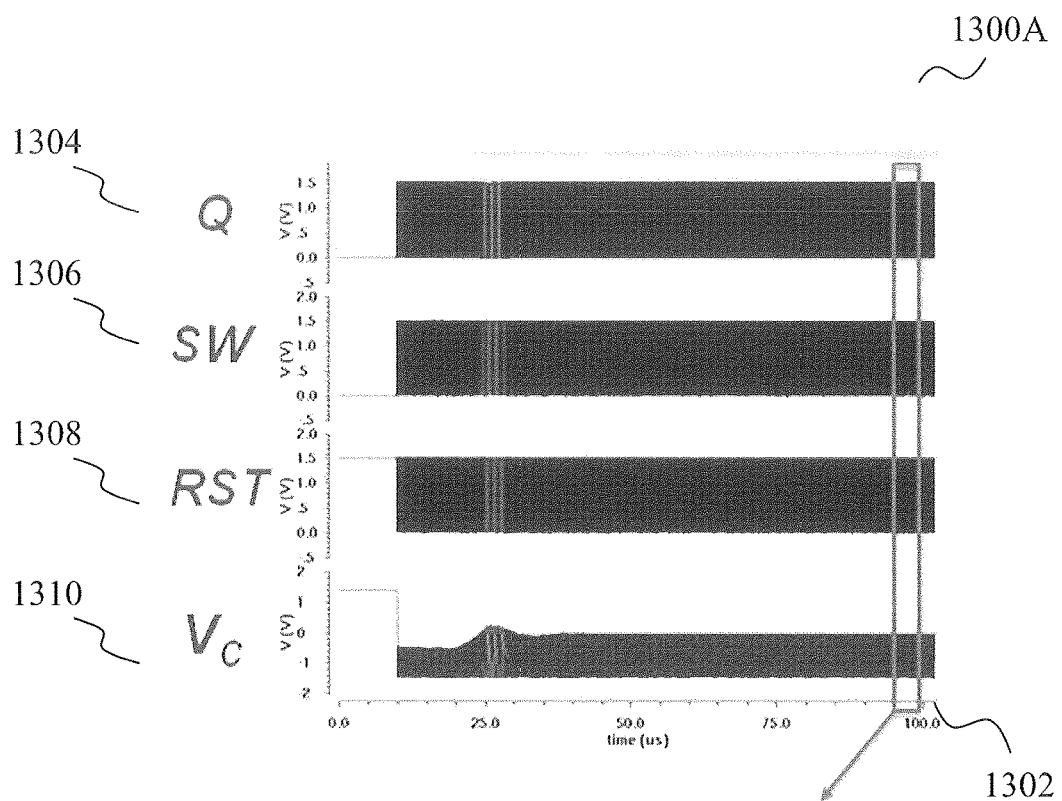
FIG. 13A shows a graph of charge signal, compare signal, reset signal and voltage across reference capacitor, plotted against time.

FIG. 13A shows a graph 1300A having a horizontal axis 1302. The horizontal axis 1302 indicates time in microseconds. The graph 1300A shows the control signals Q 1304, SW 1306 and RST 1308, as well as the reference capacitor voltage $V_C$ 1310 in the time domain in the simulation.

Figure 13B:
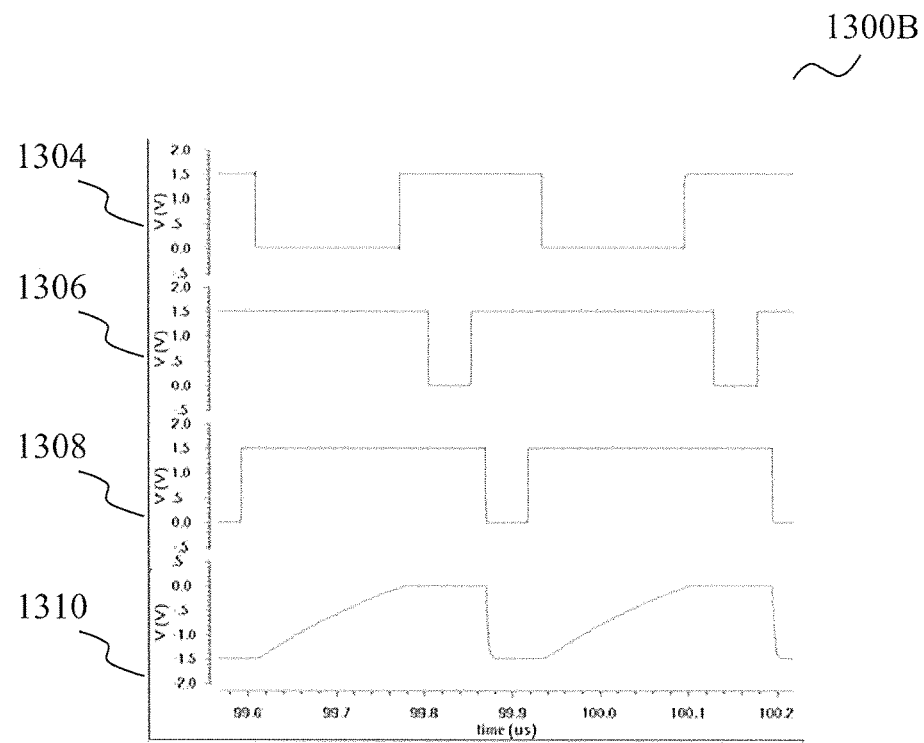
FIG. 13B shows a magnified view of the graph of FIG. 13A.

FIG. 13B shows an enlarged view 1300B of the graph 1300A of FIG. 13A, for a selected time duration. As shown in 1300B, $V_C$ 1310 reaches 0V during steady-state.

Figure 14:
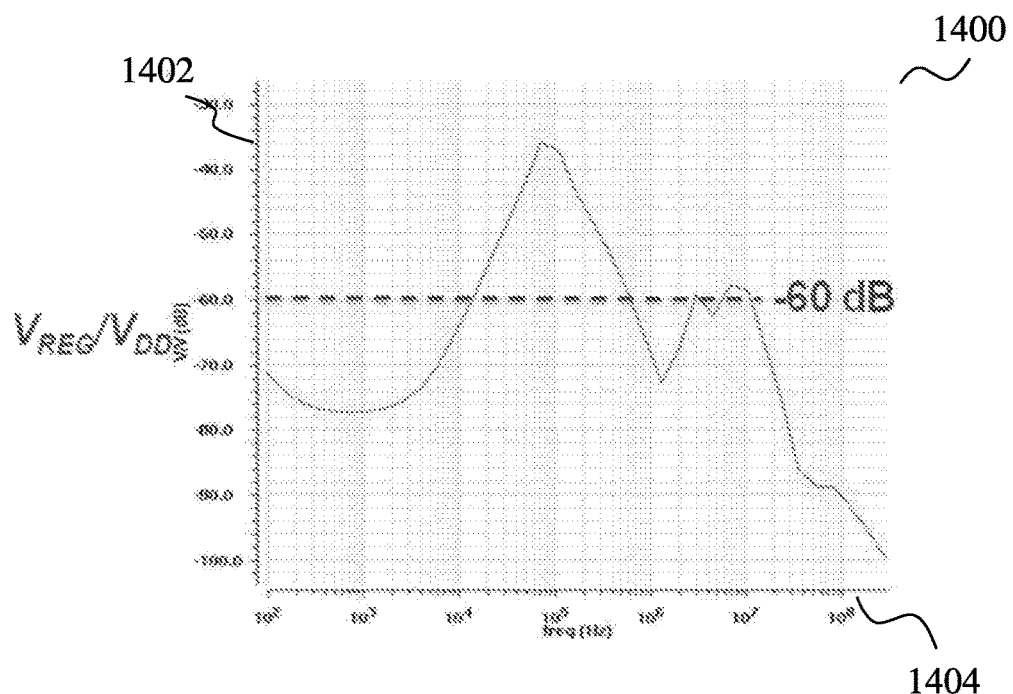
FIG. 14 shows a graph of peak signal-to-noise-ratio plotted against frequency.

FIG. 14 shows a graph 1400 having a vertical axis 1402 and a horizontal axis 1404. The vertical axis 1402 indicates the ratio between the voltage provided to the oscillator, i.e. $V_{REG}$ and the supply voltage $V_{DD}$, the ratio being indicative of the power supply rejection ratio; while the horizontal axis 1404 indicates frequency in hertz. The graph 1400 shows the results of investigating immunity of the reference clock signal generator, against a supply noise by plotting the power supply rejection ratio (PSRR) with respect to various frequencies. It can be seen from graph 1400, that the reference clock signal generator achieves a worst case PSRR of −37 dB without any help of decoupling capacitors or band-gap regulators.

Figure 15:
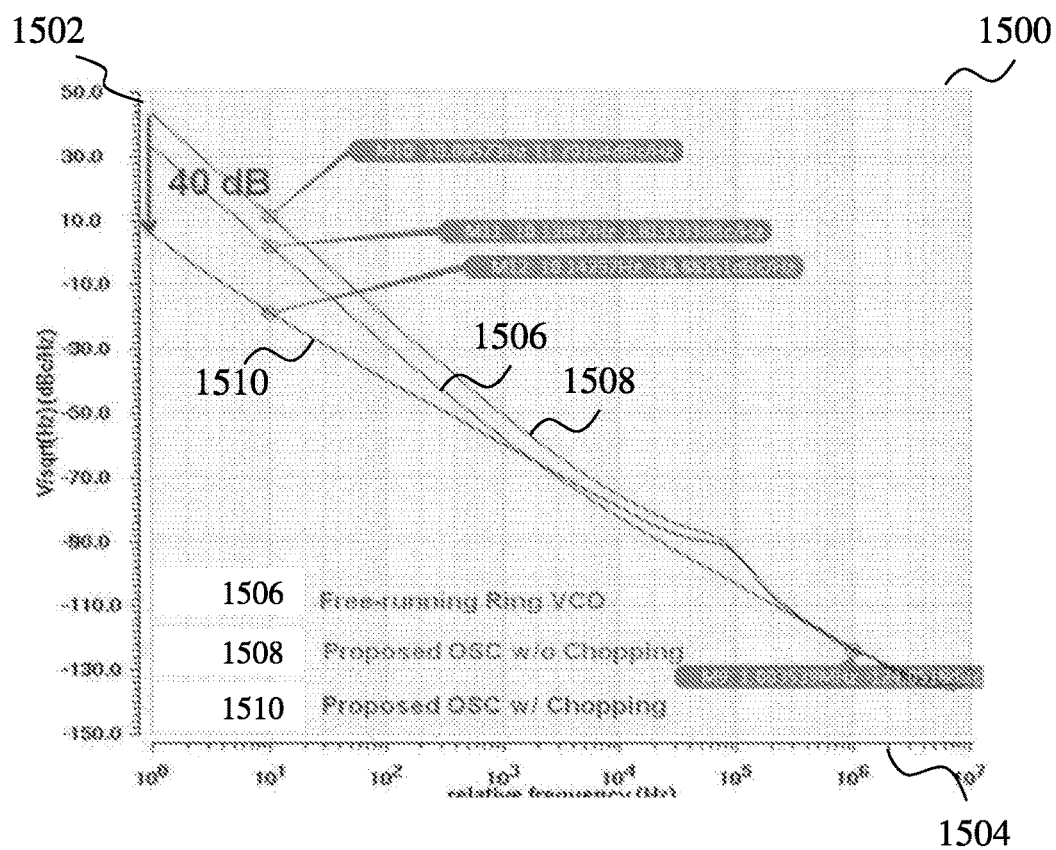
FIG. 15 shows a graph of phase noise plotted against frequency.

FIG. 15 shows a graph 1500 having a vertical axis 1502 and a horizontal axis 1504. The vertical axis 1502 indicates the amplitude of phase noise in dBc/Hz; while the horizontal axis 1504 indicates frequency in hertz. The graph 1500 includes a first plot 1506, a second plot 1508 and a third plot 1510. The first plot 1506 is a plot of the phase noise with respect to frequency, for a free-running ring voltage-controlled oscillator. The second plot 1508 is a plot of the phase noise with respect to frequency, for a reference clock generator according to various embodiments, which is not employing chopping technique. The third plot 1510 is a plot of the phase noise with respect to frequency, for a reference clock generator according to various embodiments, employing the chopping technique. As can be seen in graph 1500, the noise level at lower frequencies, i.e. the in-band noise, is improved by 40 dB by employing the chopping technique.

A reference clock signal generator according to various embodiments may be a CMOS reference clock oscillator. The CMOS reference clock oscillator may be composed of a differential period detector (PD), a differential integrator, a ring voltage-controlled oscillator (VCO) and a control logic circuit. The differential period detector may be a differential frequency-to-voltage converter. As the oscillator may be based on a fully differential architecture, it may be robust to common-mode interruptions such as supply and ground noise. A frequency-locked loop may be employed around the ring VCO so that the output frequency of the ring VCO, $f_{CLK}$ may be locked to the supply-insensitive zero-voltage charging time, $T_{0V}$. In order to compare $f_{CLK}$ with $T_{0V}$ and convert their difference into a voltage across the period detector, $V_{PD}$, the oscillator may use the differential PD based on the RC circuit shown in FIG. 16. In the differential integrator, $V_{PD}$ may be compared to the 0V which may be inherently generated by a virtual short of the differential integrator, and the comparison result changes the voltage supplied to the VCO, $V_{REG}$. The VCO may then update $f_{CLK}$ and may generate an additional 4 different phases of the clock signal, for controlling the control logic circuit. The virtual zero voltage may replace a supply-sensitive physical reference voltage, and both the supply and ground of the VCO may be regulated by the frequency-locked loop, making the proposed oscillator robust against not only supply noise but also ground noise. Since the direct current (DC) offset and flicker noise of the integrator may degrade the frequency stability against supply variation and the noise performance of the oscillator, chopper stabilization may be employed and a low pass filter composed of reference resistors and reference capacitors may be added to filter out the noise from chopping switches.

Figure 16:
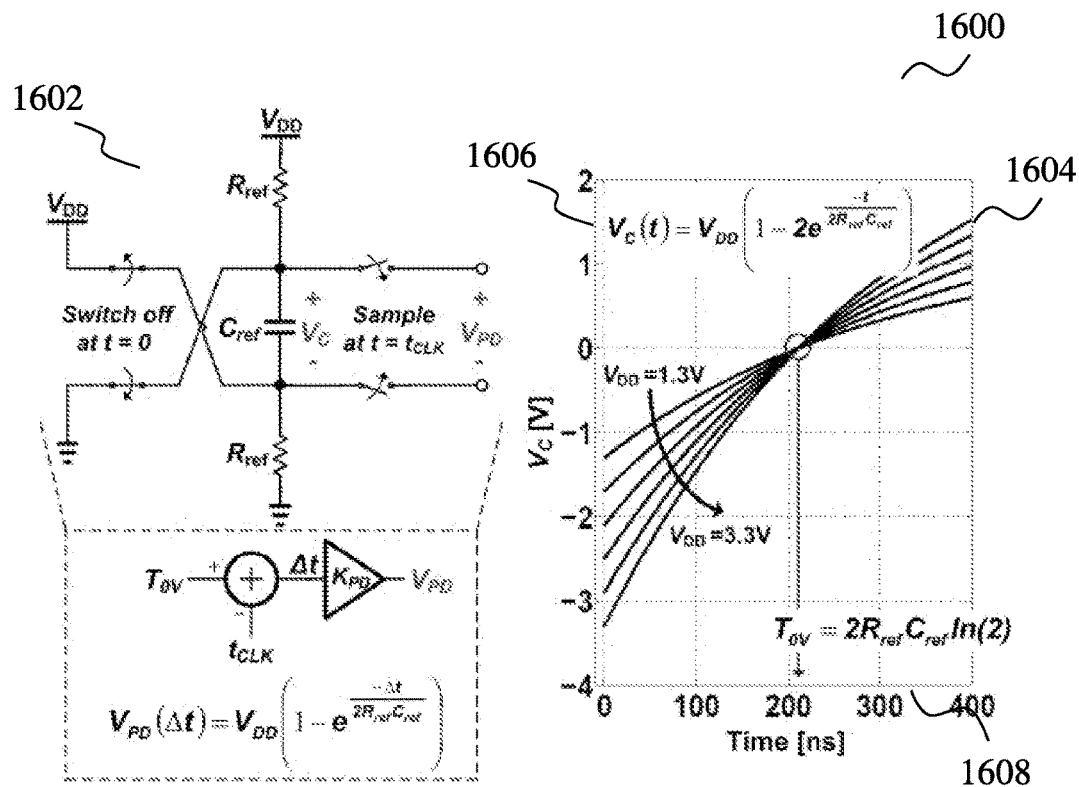
FIG. 16 shows a resistor-capacitor circuit diagram and a graph of voltage across capacitor plotted against time.

FIG. 16 shows a diagram 1600 including a circuit diagram 1602 and a graph 1604. The circuit diagram 1602 shows a simple differential resistor-capacitor (RC) circuit which may be used in a reference clock signal generator, according to various embodiments. In order for the reference clock signal generator to achieve high immunity against supply and ground noise, it is important to secure a supply-insensitive period or frequency reference based on a differential topology. Such requirements may be achieved using the differential RC circuit shown in the circuit diagram 1602. The differential RC circuit may include a reference capacitor $C_{ref}$ connected to at least one reference resistor $R_{ref}$, in series. To investigate the RC circuit, transient results of a capacitor voltage $V_C$ after switching off, as observed with various supply voltages are shown together in the graph 1604. It can be seen in the graph 1604 that the 0V-crossing time $T_{0V}$ is independent of supply variation and determined solely by the resistance $R_{ref}$ and the capacitance $C_{ref}$. Therefore, the supply insensitivity may be naturally obtained by using $T_{0V}$ as the period reference. Since the voltage across the PD sampled at a period of the output clock signal, $t_{CLK}$, indicates the difference between $T_{0V}$ and $t_{CLK}$, the RC circuit may function like a PD with a supply-insensitive period reference.

Figure 17:
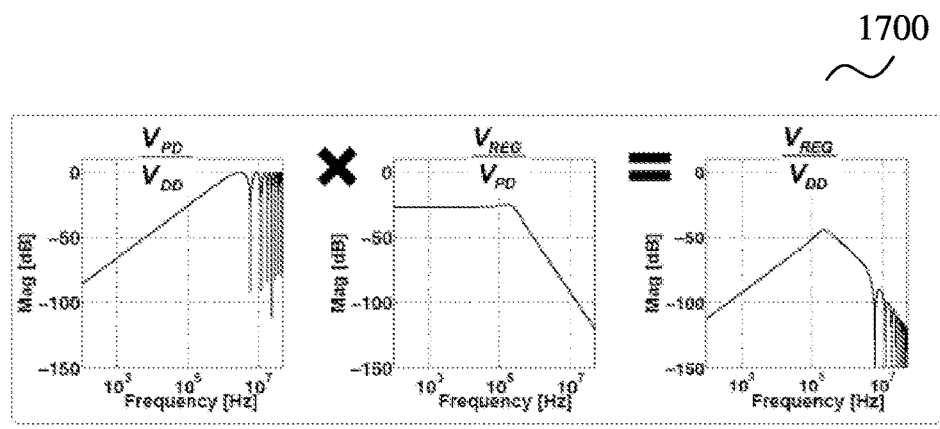
FIG. 17 shows a phase noise transfer function.

FIG. 17 shows a supply-noise transfer function 1700 of a reference clock signal generator, according to various embodiments. To investigate the supply-noise sensitivity of the reference clock signal generator, transfer functions from the supply voltage, $V_{DD}$ to the regulated voltage supplied to the oscillator, $V_{REG}$ may be simulated. The reference clock signal generator may include a period detector, also referred to herein as a frequency-to-voltage converter, may be the only block sensitive to supply noise that has high-pass characteristics ($V_{PD}/V_{DD}$) due to the first-order noise shaping. The high-frequency noise from the PD may be strongly suppressed by the frequency-locked loop action which may exhibit low-pass characteristics ($V_{REG}/V_{PD}$). Consequently, the overall transfer function may have band-pass characteristics ($V_{REG}/V_{DD}$) with a peak gain at around 100 kHz, which may be the bandwidth of the frequency-lock loop.

Figure 18:
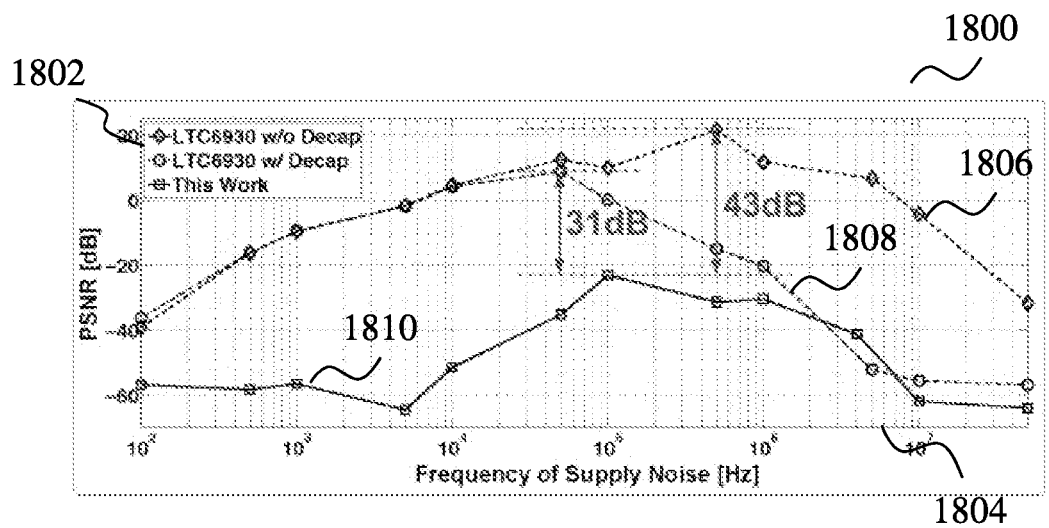
FIG. 18 shows peak signal-to-noise ratio plotted against frequency of a supply noise.

FIG. 18 shows a graph 1800 having a vertical axis 1802 and a horizontal axis 1804. The vertical axis 1802 indicates the peak signal-to-noise ratio (PSNR); while the horizontal axis 1804 indicates the frequency in hertz, of the supply noise. In order to quantify the dynamic supply-noise sensitivity, the peak signal-to-noise ratio (PSNR) performance may be measured with a sinusoidal tone of 200 mV peak-to-peak. The graph includes a first plot 1806, a second plot 1808 and a third plot 1810. The first plot 1806 is a PSNR plot of a commercial oscillator without a decoupling capacitor while the second plot 1808 is a PSNR plot of the same commercial oscillator with a decoupling capacitor of 100 nF. The third plot 1810 is a PSNR plot of a reference clock signal generator according to various embodiments. The reference clock signal generator may achieve a worst-case PSNR of −22 dB at 100 kHz without any internal and external capacitors, which is 43 dB and 31 dB lower as compared to the first plot 1806 and the second plot 1808, respectively.

Figure 19:
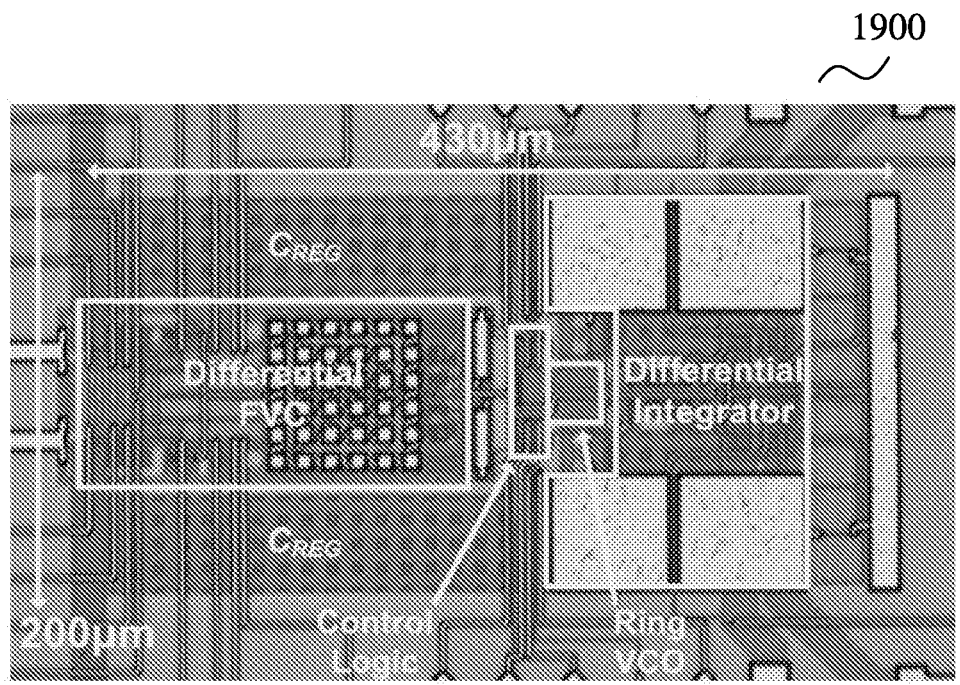
FIG. 19 shows a reference clock oscillator, according to various embodiments.

FIG. 19 shows an oscillator 1900, according to various embodiments. The CMOS oscillator 1900 may be fabricated in a 0.18 µm standard CMOS process and may occupies an overall area of about 430×200 µm². The CMOS oscillator 1900 may not include any internal decoupling capacitors or bandgap regulators. The oscillator 1900 may consume 53 µW from 1.4V supply at the output frequency of 4.7 MHz.

Figure 20:
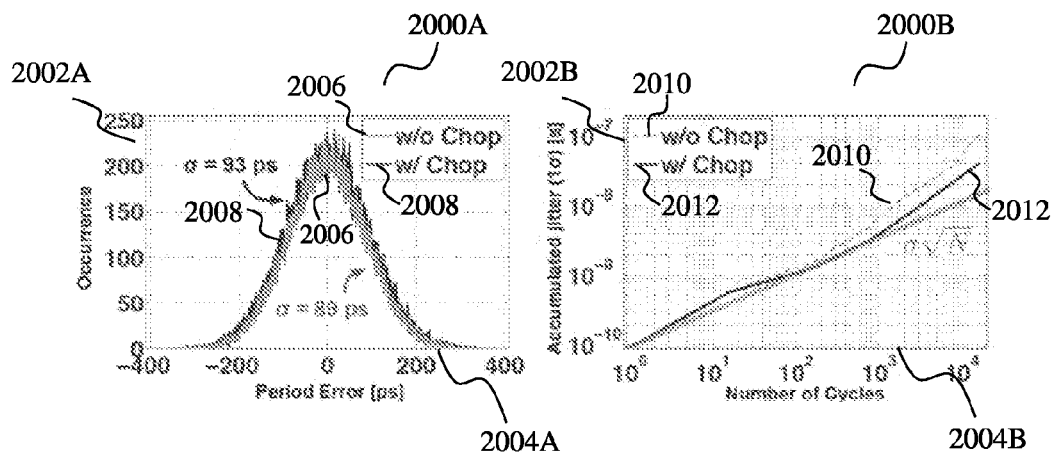
FIG. 20 shows a first graph showing occurrence of jitter plotted against period error and a second graph showing accumulated jitter plotted against number of cycles.

FIG. 20 shows a first graph 2000A and a second graph 2000B. The first graph 2000A shows a measured jitter of a reference clock generator according to various embodiments, with and without employing a chopping technique. The first graph 2000A includes a vertical axis 2002A and a horizontal axis 2004A. The vertical axis 2002A indicates occurrence of jitter while the horizontal axis 2004A indicates period error in picoseconds. The first graph 2000A includes a first plot 2006 showing occurrence of jitter when the reference clock generator does not employ chopping technique; and a second plot 2008 showing an occurrence of jitter when the reference clock generator employs chopping technique. The root mean square value of period jitter for the first plot 2006, is 89 ps. The root mean square value of period jitter for the second plot 2008, is 93 ps. Therefore, the use of the chopping technique may degrade the period jitter by only 4 ps.

The second graph 2000B in FIG. 20 shows an accumulated jitter performance of the of the reference clock generator, with and without employing a chopping technique. The second graph 2000B includes a vertical axis 2002B and a horizontal axis 2004B. The vertical axis 2002B indicates accumulated jitter while the horizontal axis 2004B indicates a number of cycles. The second graph 2000B includes a first plot 2010 showing the accumulated jitter when the reference clock generator does not employ chopping technique; and a second plot 2012 showing the accumulated jitter when the reference clock generator employs chopping technique. As can be seen from the second graph 2000B, the use of chopping technique may improve the long-term jitter by approximately a factor of two at the $10^4$th cycle due to the flicker noise suppression. The inclining slope of $\sigma\sqrt{N}$ for the first 1000 cycles may be clearly observed from the measured accumulated jitter, where N indicates the number of cycles and a indicates the root mean square value of the period jitter.

Figure 21:
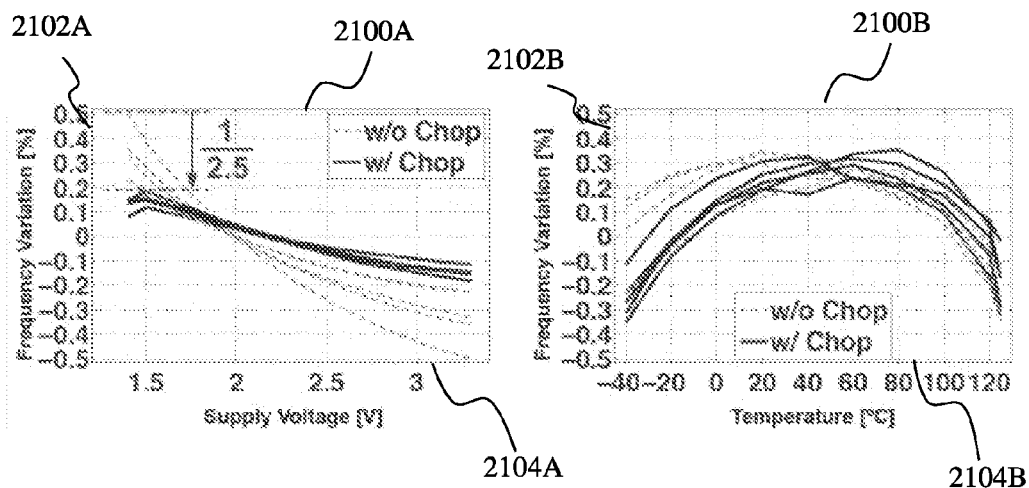
FIG. 21 shows a first graph showing frequency variation plotted against supply voltage and a second graph showing frequency variation plotted against temperature.

FIG. 21 shows a first graph 2100A and a second graph 2100B. The first graph 2100A shows a frequency variation of a reference clock generator according to various embodiments, with and without employing a chopping technique, with respect to supply voltage. The first graph 2100A includes a vertical axis 2102A and a horizontal axis 2104A. The vertical axis 2102A indicates a frequency variation in percentage while the horizontal axis 2104A indicates supply voltage in volts. The second graph 2100B shows a frequency variation of the reference clock generator, with and without employing a chopping technique, with respect to temperature. The second graph 2100B includes a vertical axis 2102B and a horizontal axis 2104B. The vertical axis 2102B indicates frequency variation in percentage while the horizontal axis 2104B indicates temperature in degrees Celsius. FIG. 21 shows the measured frequency stability of the reference clock signal generator. By removing the DC-offset of the integrator through the chopper stabilization so that the oscillator may be more precisely locked at $T_{OP}$, the frequency stability over supply variation may be improved by more than 2.5 times and the oscillator may achieve the frequency variation of less than ±0.2% for the supply change from 1.4V to 3.3V. For the temperature change from −40° C. to 125° C., the oscillation frequency may vary by less than ±0.35%.

FIG. 22 shows a graph 2200 having a vertical axis 2202 and a horizontal axis 2204. The vertical axis 2202 indicates phase noise in dBc/Hz; while the horizontal axis 2204 indicates offset frequency in hertz. The graph 2200 includes a first plot 2206 and a second plot 2208. The first plot 2206 is the phase noise of a first reference clock signal generator with respect to the offset frequency. The offset frequency is the offset from the carrier frequency. The second plot 2208 is the phase noise of a second reference clock signal generator with respect to the offset frequency. The first reference clock signal generator and the second reference clock signal generator are similar, except that the first reference clock signal generator does not employ chopping technique while the second reference clock signal generator employs chopping technique. The graph 2200 shows that the low-frequency noise is significantly suppressed by the chopper stabilization though the generated chopping spur is observed at 1.2 MHz offset. This enables the reference clock signal generator to achieve a phase noise of −63 dBc/Hz at 1 kHz offset. At a large offset frequency of 1 MHz, the phase noise is −123 dBc/Hz. The phase noise can be seen to be declining between 200 Hz and 1 MHz, with a −20 dB/decade declining slope. The peak at 100 kHz offset caused by the integrator may be suppressed by reducing the bandwidth of the frequency-locked loop.

FIG. 23 shows a table 2300 summarizing the performance of a reference clock signal generator according to various embodiments, as compared to other state-of-the-art designs. It can be seen that the frequency stability to supply and temperature variation may be comparable to, or even better than the state-of-the-art clock generators, even without the use of decoupling capacitors or band-gap regulators.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

The invention claimed is:

1. A method for generating a reference clock signal, the method comprising:
   discharging a capacitive element to a discharged state, when a reset signal has a predetermined reset state;
   charging the capacitive element from the discharged state to a first voltage, when a charge signal has a predetermined charge state;
   comparing the first voltage to a zero voltage, when a compare signal has a predetermined compare state;
   generating a second voltage based on the comparing of the first voltage to the zero voltage;
   generating a clock signal based on the second voltage, using an oscillator; and
   generating each of the reset signal, the charge signal and the compare signal, based on the clock signal.

2. The method of claim 1, wherein the zero voltage is a virtual zero voltage at input terminals of an operational amplifier, the operational amplifier being connected to a negative feedback loop.

3. The method of claim 1, wherein the capacitive element is in the discharged state when a voltage across the capacitive element is a negative value of a supply voltage.

4. The method of claim 3, wherein the capacitive element is charged to the first voltage by a resistive element coupled to the supply voltage.

5. The method of claim 4, wherein a time taken to charge the capacitive element from the discharged state to zero voltage is dependent on a capacitance of the capacitive element and a resistance of the resistive element.

6. The method of claim 1, wherein a frequency of the clock signal is dependent on the time taken to charge the capacitive element from the discharged state to zero voltage.

7. The method of claim 1, wherein generating the charge signal comprises dividing the clock signal.

8. The method of claim 1, further comprising:
phase shifting the clock signal to provide a first output signal, a second output signal, a third output signal, a fourth output signal and an output clock signal.

9. The method of claim 8, wherein each of the first output signal, the second output signal, the third output signal, the fourth output signal and the output clock signal is phase-shifted from the clock signal by different multiples of a phase shift constant, respectively.

10. A reference clock signal generator comprising:
a discharging circuit configured to discharge a capacitive element to a discharged state, when a reset signal has a predetermined reset state;
a charging circuit configured to charge the capacitive element from the discharged state to a first voltage, when a charge signal has a predetermined charge state;
a comparison circuit configured to compare the first voltage to a zero voltage when a compare signal has a predetermined compare state, wherein the comparison circuit is further configured to generate a second voltage based on the comparing of the first voltage to the zero voltage;
an oscillator configured to generate a clock signal based on the second voltage; and
a control logic circuit configured to generate each of the reset signal, the charge signal and the compare signal, based on the clock signal.

11. The reference clock signal generator of claim 10, wherein at least one of the discharging circuit or the charging circuit comprises a differential frequency-to-voltage converter.

12. The reference clock signal generator of claim 10, wherein the comparison circuit comprises a differential integrator.

13. The reference clock signal generator of claim 10, wherein the oscillator comprises a voltage-controlled oscillator.

14. The reference clock signal generator of claim 10, wherein the charging circuit comprises a resistive element.

15. The reference clock signal generator of claim 14, wherein the resistive element has a low temperature coefficient.

16. The reference clock signal generator of claim 10, wherein both the discharging circuit and the charging circuit are coupled to a common supply voltage.

17. The reference clock signal generator of claim 10, further comprising:
a plurality of chopping switches coupled to the comparison circuit.

18. The reference clock signal generator of claim 17, wherein the plurality of chopping switches are configured to be operated by a chop signal, the chop signal being dependent on the clock signal.

19. The reference clock signal generator of claim 10, further comprising:
a low pass filter configured to receive the second voltage and further configured to provide a filtered voltage to the oscillator.

20. The reference clock signal generator of claim 10, wherein the comparison circuit comprises an operational amplifier connected to a negative feedback loop, wherein input terminals of the operational amplifier are configured to provide the zero voltage.

* * * * *